US012740070B2

(12) United States Patent
Kim

(10) Patent No.: US 12,740,070 B2
(45) **Date of Patent: *Sep. 15, 2026**

(54) SEMICONDUCTOR MEMORY DEVICE

(71) Applicant: Samsung Electronics Co., Ltd., Suwon-si (KR)

(72) Inventor: Song Yi Kim, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 202 days.

This patent is subject to a terminal disclaimer.

(21) Appl. No.: 18/665,005

(22) Filed: May 15, 2024

(65) Prior Publication Data

US 2024/0306400 A1 Sep. 12, 2024

Related U.S. Application Data

(63) Continuation of application No. 17/329,700, filed on May 25, 2021, now Pat. No. 12,016,186.

(30) Foreign Application Priority Data

Jun. 15, 2020 (KR) ........................ 10-2020-0072485
Dec. 22, 2020 (KR) ........................ 10-2020-0181275

(51) Int. Cl.

*H10B 63/00* (2023.01)
*H01L 29/06* (2006.01)
*H01L 29/423* (2006.01)
*H01L 29/78* (2006.01)
*H01L 29/786* (2006.01)
*H10D 30/62* (2025.01)

(Continued)

(52) U.S. Cl.

CPC ......... *H10B 63/30* (2023.02); *H10D 30/6211* (2025.01); *H10D 30/6735* (2025.01); *H10D 30/6757* (2025.01); *H10D 62/118* (2025.01)

(58) Field of Classification Search

CPC .... H10D 30/014; H10D 30/024; H10D 30/43; H10D 30/62; H10D 30/6211;

(Continued)

(56) References Cited

U.S. PATENT DOCUMENTS 8,022,381 B2 9/2011 Toda
8,502,322 B2 8/2013 Nitta (Continued)

FOREIGN PATENT DOCUMENTS

JP 2005167093 A 6/2005
JP WO2010140210 A1 12/2010

(Continued)

*Primary Examiner* — David C Spalla

(74) *Attorney, Agent, or Firm* — Muir Patent Law, PLLC

(57) ABSTRACT

A semiconductor memory device includes: first conductive lines provided on a substrate and extending in a first direction in parallel, each of the first conductive lines including a first end portion and a second end portion that are opposite to each other, the first direction being parallel to a top surface of the substrate; first selection transistors respectively connected to the first end portions of the first conductive lines; and second selection transistors respectively connected to the second end portions of the first conductive lines. Each of the first selection transistors may have a first gate width. Each of the second selection transistors may have a second gate width smaller than the first gate width.

20 Claims, 38 Drawing Sheets

(51) Int. Cl.
*H10D 30/67* (2025.01)
*H10D 62/10* (2025.01)

(58) Field of Classification Search
CPC ........... H10D 30/6212; H10D 30/6213; H10D 30/6735; H10D 30/6757; H10D 62/118; H10D 62/119; H10D 62/121; H10D 84/0158; H10D 84/0193; H10D 84/834; H10D 84/853; H10B 63/30; H10B 63/80
See application file for complete search history.

(56) References Cited

U.S. PATENT DOCUMENTS 8,686,393 B2 4/2014 Yu et al.
8,730,710 B2 5/2014 Baek et al.
8,759,979 B2 6/2014 Lee
8,982,605 B2 3/2015 Park et al.
9,070,577 B2 6/2015 Lee
9,252,097 B2 2/2016 Baba
9,514,807 B2 12/2016 Kang et al.
9,792,980 B2 10/2017 Perner et al.
12,016,186 B2 * 6/2024 Kim .................. H10D 30/6735
2010/0001337 A1 1/2010 Kim et al.
2013/0237050 A1 9/2013 Kikutani
2015/0243887 A1 8/2015 Saitoh et al.
2018/0294277 A1 * 10/2018 Kim ........................ G11C 8/08

FOREIGN PATENT DOCUMENTS

JP 2014053565 A 3/2014
JP 2019121805 A 7/2019
KR 1020070109825 A 11/2007

* cited by examiner

MEM
10
20
21
22
MWL0
MWLn
SA00
SA01
SA10
SA11
SWD
SWL0
SWL1
SWL2
SWL3
LBL0
LBL1
LBL2
LBL3
MC
11
12
YST
GBL0
YS0
YS1
YS2
YS3
D1
D2

300
MC
MC
MC
SWL
11
12
LBL
CT
120
109
107
111
109
107
111
109
107
111
109
107
103
101
200
100
SD
G
WST2
WST1
BST
22
21a/21b
IA
IA'
D3
D2

BST
WST2
WST1
GP
GS
GI
103
101
IF'
TC
GEP3
GW3
G3
DT1
IF
IE'
GEP2
G2
GW2
IE
ID'
GEP1
G1
GW1
ID

BST
WST2
WST1
GP
GI
103
101
G1
GW1
ID
ID'
IE
IE'
IF
IF'
H2
GP
US2
G2
GW2
AF2
SW2
H3
G3
AF3
GW3
US3
SW3

Figure 12:
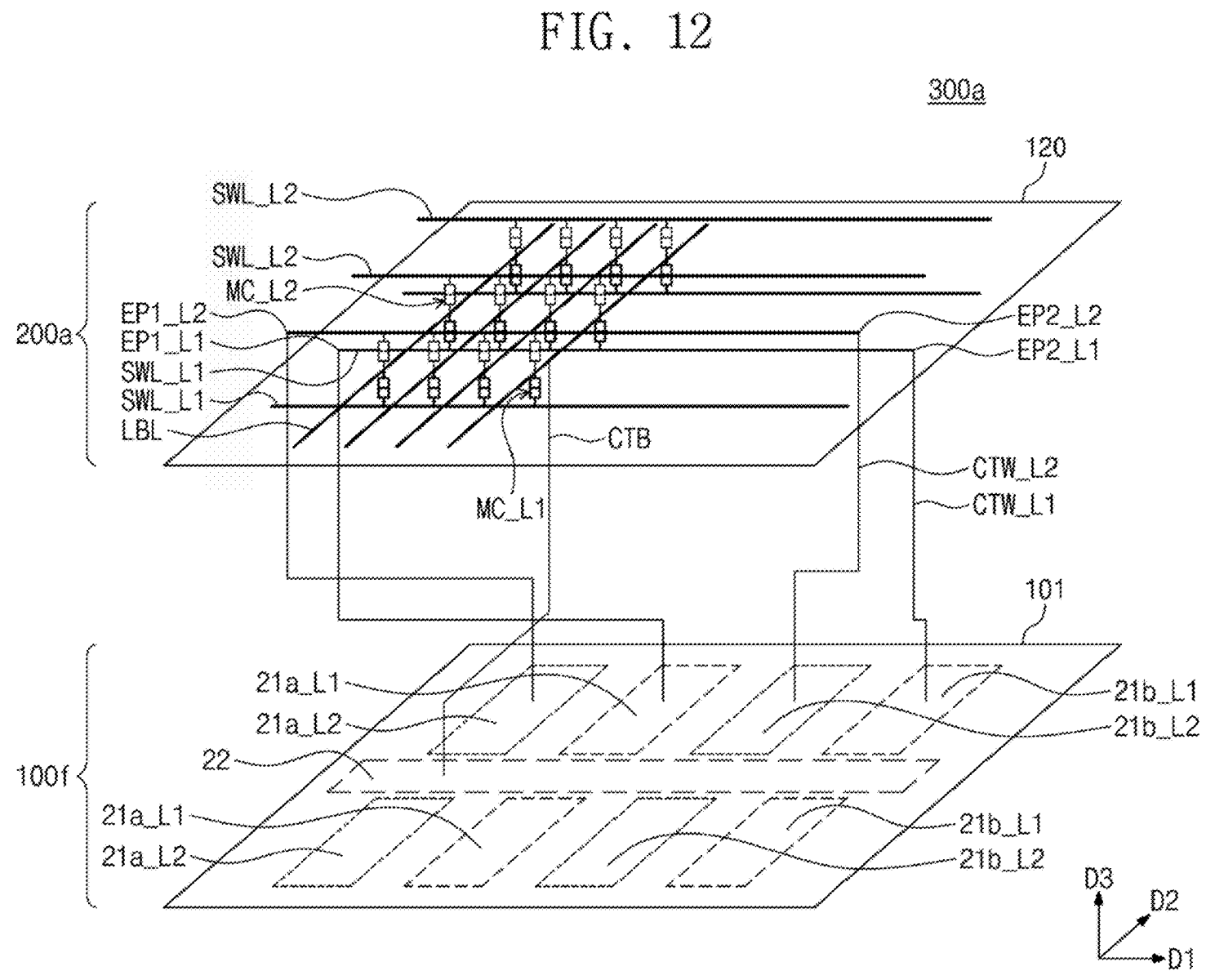

120
EP2_L2
EP2_L1
CTW_L2
CTW_L1
101
21b_L1
21b_L2
21b_L1
21b_L2
D2
D1
D3
CTB
MC_L1
SWL_L2
SWL_L2
MC_L2
EP1_L2
EP1_L1
SWL_L1
SWL_L1
LBL
21a_L1
21a_L2
22
21a_L1
21a_L2
200a
100f

Figure 18:
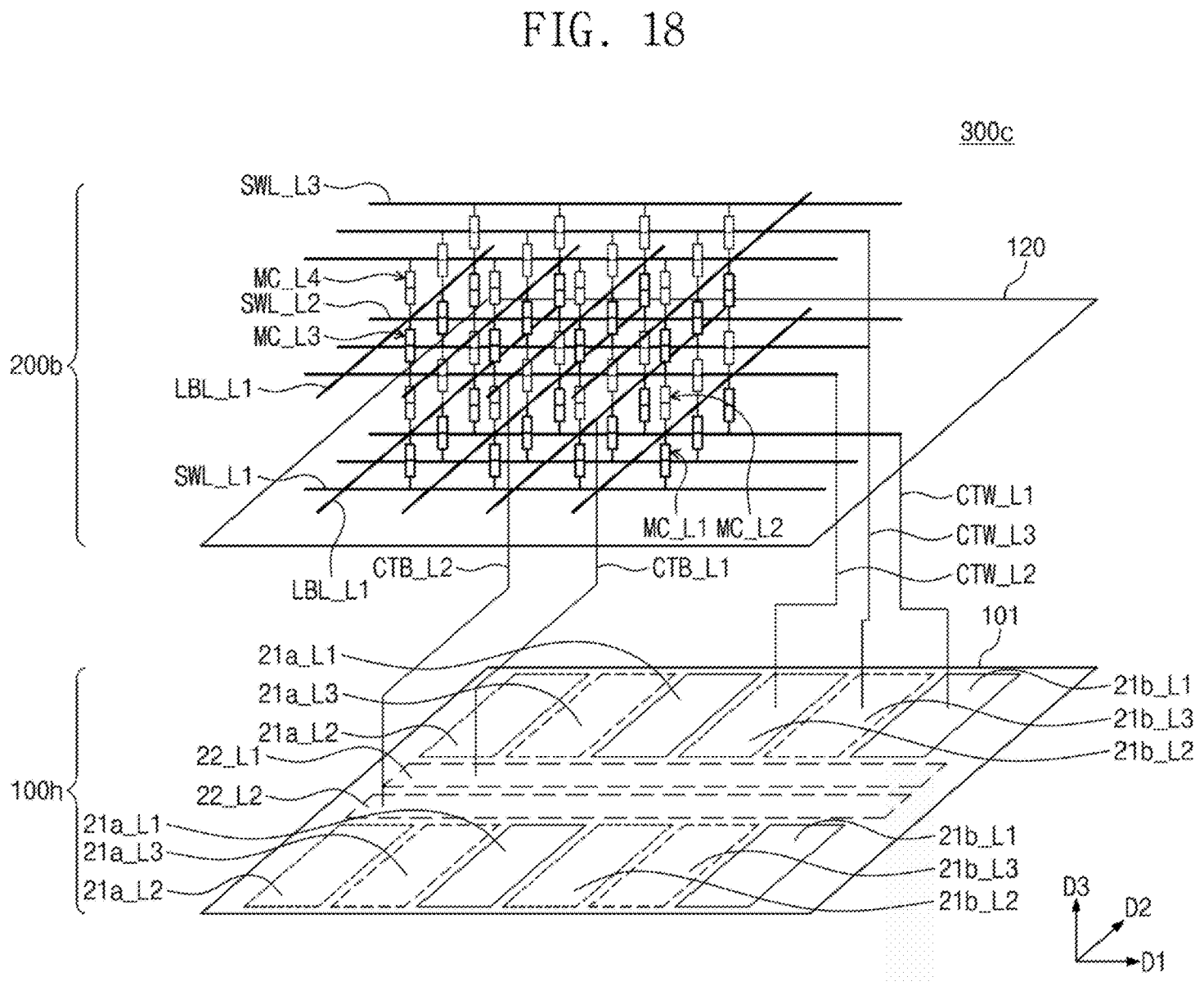

CTW_L1
CTW_L3
CTW_L2
101
21b_L1
21b_L3
21b_L2
D2
D1
D3
MC_L2
MC_L1
CTB_L1
CTB_L2
LBL_L1
SWL_L3
MC_L4
SWL_L2
MC_L3
LBL_L1
SWL_L1
21a_L1
21a_L3
21a_L2
22_L1
22_L2
21a_L1
21a_L3
21a_L2
200b
100h

300d
120
101
200d
100g
LBL
MC_L1
MC_L2
CTB
SWL_L1
SWL_L2
SWL_L3
EP1_L1
EP2_L1
EP2_L2
CTW_L1
CTW_L2
21_L1
21_L2
22
D1
D2
D3

BST
22

GW1
21_L1
WST_L1
21_L2
WST_L2
GW2

21_L1
WST_L1
21_L2
WST_L2

GW3

D1
D2

SEMICONDUCTOR MEMORY DEVICE

CROSS-REFERENCE TO RELATED APPLICATIONS

This Application is a continuation application of U.S. patent application Ser. No. 17/329,700, filed May 25, 2021, which is incorporated by reference herein in its entirety and claims priority to Korean Patent Application No. 10-2020-0072485, filed on Jun. 15, 2020 in the Korean Intellectual Property Office, and Korean Patent Application No. 10-2020-0181275, filed on Dec. 22, 2020 in the Korean Intellectual Property Office, each of which is incorporated by reference herein in their entirety.

BACKGROUND OF THE INVENTION

1. Field

Embodiments relate to a semiconductor memory device.

2. Description of the Related Art

In general, semiconductor memory devices are classified into volatile memory devices and nonvolatile memory devices. The volatile memory devices lose their stored data when their power supply is interrupted, and a dynamic random access memory (DRAM) device and a static random access memory (SRAM) device are typical examples of the volatile memory devices. By contrast, the nonvolatile memory devices retain their data even when their power supply is interrupted and a programmable read only memory (PROM) device, an erasable PROM (EPROM) device, an electrically EPROM (EEPROM) device, and a flash memory device are typical examples of the nonvolatile memory devices.

SUMMARY

Embodiments are directed to a semiconductor memory device, including: first conductive lines provided on a substrate and extending in a first direction in parallel, each of the first conductive lines including a first end portion and a second end portion that are opposite to each other, the first direction being parallel to a top surface of the substrate; first selection transistors respectively connected to the first end portions of the first conductive lines; and second selection transistors respectively connected to the second end portions of the first conductive lines. Each of the first selection transistors may have a first gate width. Each of the second selection transistors may have a second gate width smaller than the first gate width.

Embodiments are also directed to a semiconductor memory device, including: a cell array portion disposed on a peripheral circuit portion. The cell array portion may include: first conductive lines, which extend in a first direction and are spaced apart from each other in a second direction crossing the first direction; second conductive lines, which are provided on the first conductive lines and extend in the second direction and are spaced apart from each other in the first direction; and memory cells respectively disposed between the first conductive lines and the second conductive lines. The peripheral circuit portion may include: first selection transistors, which are disposed on a substrate and are connected to the first conductive lines; and second selection transistors, which are disposed on the substrate and are connected to the second conductive lines. Each of the first selection transistors may have a first gate width. Each of the second selection transistors may have a second gate width that is different from the first gate width.

Embodiments are also directed to a semiconductor memory device, including: first conductive lines provided on a substrate and extending in a first direction; second conductive lines provided on the first conductive lines and extending in a second direction crossing the first direction; third conductive lines provided on the second conductive lines and extending in the first direction; fourth conductive lines provided on the third conductive lines and extending in the second direction; and first, second, third, and fourth selection regions, which are provided on the substrate and are connected to the first to fourth conductive lines, respectively. The first selection region and the third selection region may be spaced apart from each other in the first direction. The second selection region and the fourth selection region may be spaced apart from each other in the second direction and have a shape elongated in the first direction. An area of the first selection region may be different from an area of the third selection region, or an area of the second selection region may be different from an area of the fourth selection region.

BRIEF DESCRIPTION OF THE DRAWINGS

Features will become apparent to those of skill in the art by describing in detail example embodiments with reference to the attached drawings in which:

FIG. 12 is a perspective view illustrating a connection structure between a cell array portion and a peripheral circuit portion of FIG. 11.

FIGS. 13A to 13D are plan views, each of which illustrates a peripheral circuit portion according to an example embodiment.

FIG. 15 is a perspective view illustrating a connection structure between a cell array portion and a peripheral circuit portion of FIG. 14.

FIGS. 16A and 16B are plan views, each of which illustrates a peripheral circuit portion according to an example embodiment.

FIG. 18 is a perspective view illustrating a connection structure between a cell array portion and a peripheral circuit portion of FIG. 17.

FIGS. 19A and 19B are plan views, each of which illustrates a peripheral circuit portion according to an example embodiment.

FIG. 20 is a diagram illustrating a modified example of the connection structure of FIG. 12.

FIG. 21 is an enlarged plan view illustrating a peripheral circuit portion in FIG. 20.

DETAILED DESCRIPTION

Figure 1:
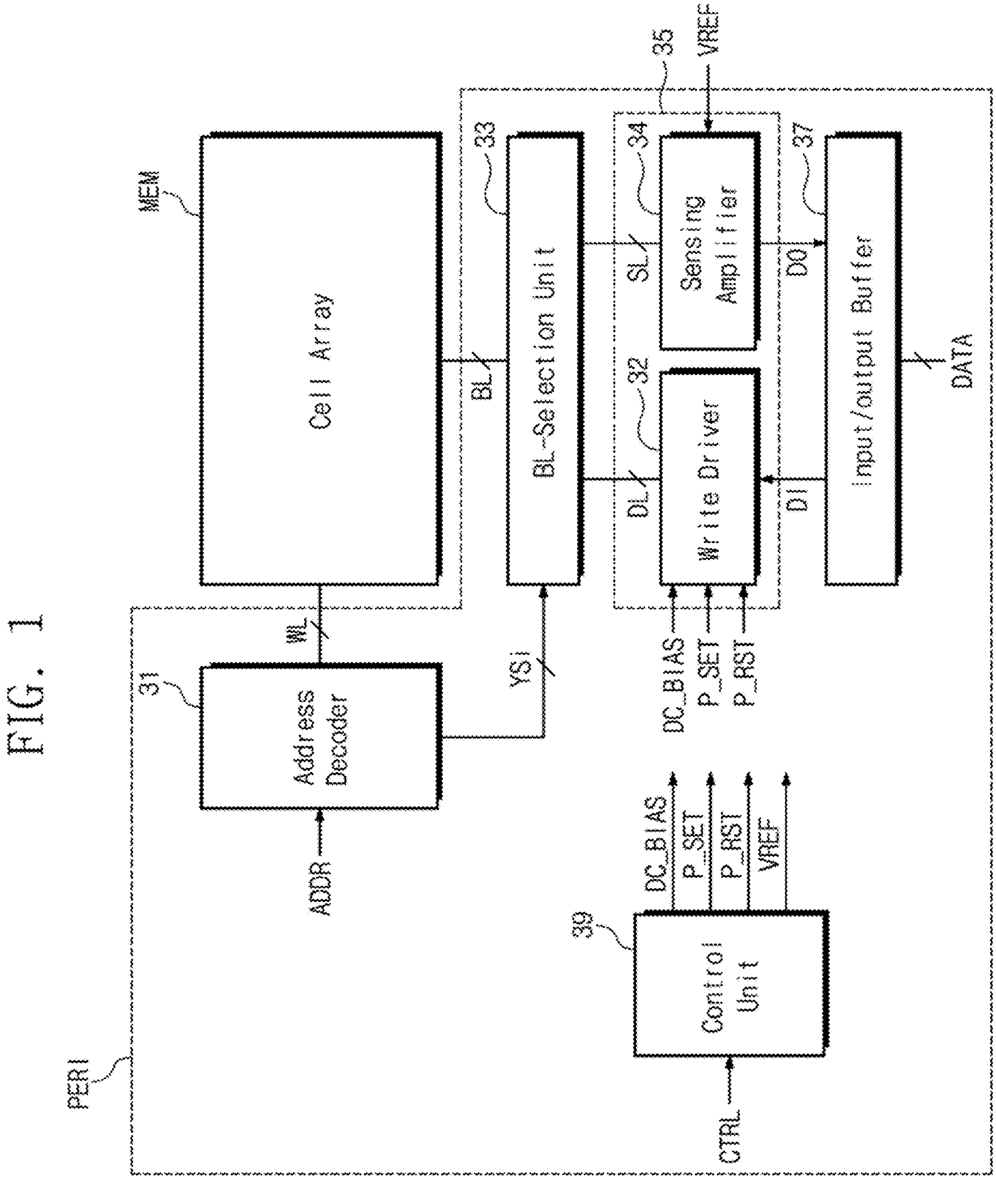
FIG. 1 is a block diagram schematically illustrating a semiconductor memory device according to an example embodiment.

FIG. 1 is a block diagram schematically illustrating a semiconductor memory device according to an example embodiment.

Referring to FIG. 1, the semiconductor memory device may include a memory region MEM and a peripheral circuit region PERI near the memory region MEM.

In an example embodiment, a memory cell array including memory cells and cell driving circuits driving the memory cells may be disposed in the memory region MEM. The memory cell array may include a plurality of word lines WL and a plurality of bit lines BL. The memory cells may be located at intersections of the word lines WL and the bit lines BL. Each of the memory cells may include a variable resistance pattern whose resistance can be switched to one of at least two different values by an electric pulse applied thereto. For example, the variable resistance pattern may be formed of or include at least one of phase change materials, transition metal oxides, or magnetic materials. In an example embodiment, the memory cells may include a phase change material whose crystal structure or phase can be controlled depending on an amount of electric current passing therethrough. The memory cells and the cell selection circuits will be described in more detail with reference to FIGS. 2 and 3.

An address decoder 31, a bitline (BL)-selection unit 33, a data input/output circuit 35, an input/output buffer 37, and a control unit 39 may be disposed in the peripheral circuit region PERI.

The address decoder 31 may be configured to decode an address ADDR, which is input from the outside, and to select the word lines WL and the bit lines BL based on the decoded address. The address ADDR may include a row address, for selecting the word line WL, and a column address, for selecting the bit line BL. The address decoder 31 may be configured to produce a BL-selection signal YSi, which is used to select the bit line BL, and to provide the BL-selection signal YSi to the BL-selection unit 33.

The BL-selection unit 33 may be connected to the memory region MEM through the bit lines BL, and may be connected to the data input/output circuit 35 through a data line DL and a sensing line SL. The BL-selection unit 33 may connect the bit line BL to the data line DL or the sensing line SL in response to the BL-selection signal YSi provided from the address decoder 31. In an example embodiment, the bit lines BL connected to the memory cells may have a hierarchical or multi-level structure including a plurality of global bit lines GBL0 (e.g., see FIG. 2) and a plurality of local bit lines LBL0-LBL3 (e.g., see FIG. 2). In this case, the BL-selection unit 33 may include a global BL-selection unit, which selects one of the global bit lines GBL0 of FIG. 2, and a local BL-selection unit, which selects one of the local bit lines LBL0-LBL3 of FIG. 2. In an example embodiment, the global BL-selection unit may be disposed in the peripheral circuit region PERI, and the local BL-selection unit may be disposed in the memory region MEM.

The data input/output circuit 35 may be configured to write data DI in the memory cell array or to read data DO from the memory cell array. The data input/output circuit 35 may include a write driver 32 and a sensing amplifier 34.

The write driver 32 may provide a program or write current to the selected bit line BL through the data line DL during a write operation. For example, the write driver 32 may receive a set pulse P_SET or a reset pulse P_RST from the control unit 39, and may produce a set or reset current. The write driver 32 may receive the data DI from the input/output buffer 37, and may provide the set or reset current to the selected bit line BL through the BL-selection unit 33. The write driver 32 may control an amount of current to be supplied to the selected bit line BL, depending on a bias voltage DC_BIAS provided from the control unit 39. For example, the write driver 32 may provide the set current to a memory cell in response to the set pulse P_SET, when data '0' is input, and may provide the reset current to a memory cell in response to the reset pulse P_RST, when data '1' is input.

The sensing amplifier 34 may read out from the data DO of the selected memory cell through the sensing line SL during a read operation. For example, during the read operation, the sensing amplifier 34 may provide a read current to the memory cell array through the sensing line SL. The sensing amplifier 34 may read out the data DO, which is stored in the memory cell, through comparison between a voltage of the sensing line SL and a reference voltage during the read operation. The data DO, which is read out by the sensing amplifier 34, may be output to the outside through the input/output buffer 37.

The input/output buffer 37 may be configured to provide data DATA, which is input from the outside, to the write driver 32, or to output the data DATA, which is read out from the sensing amplifier 34, to the outside.

The control unit 39 may output various control signals, which are used to control the semiconductor memory device, in response to a command signal CTRL provided from the outside. For example, the control unit 39 may control the operation of the write driver 32 during the write operation, and may control the operation of the sensing amplifier 34 during the read operation. For example, the control unit 39 may provide the set pulse P_SET or the reset pulse P_RST, to produce a program current, to the write driver 32 during the write operation. The control unit 39 may also provide the bias voltage DC_BIAS, to control an amount of current supplied to the memory cell, to the write driver 32. The control unit 39 may provide a reference voltage VREF, which is used for comparison with a voltage of the sensing line SL, to the sensing amplifier 34 during the read operation.

Figure 2:
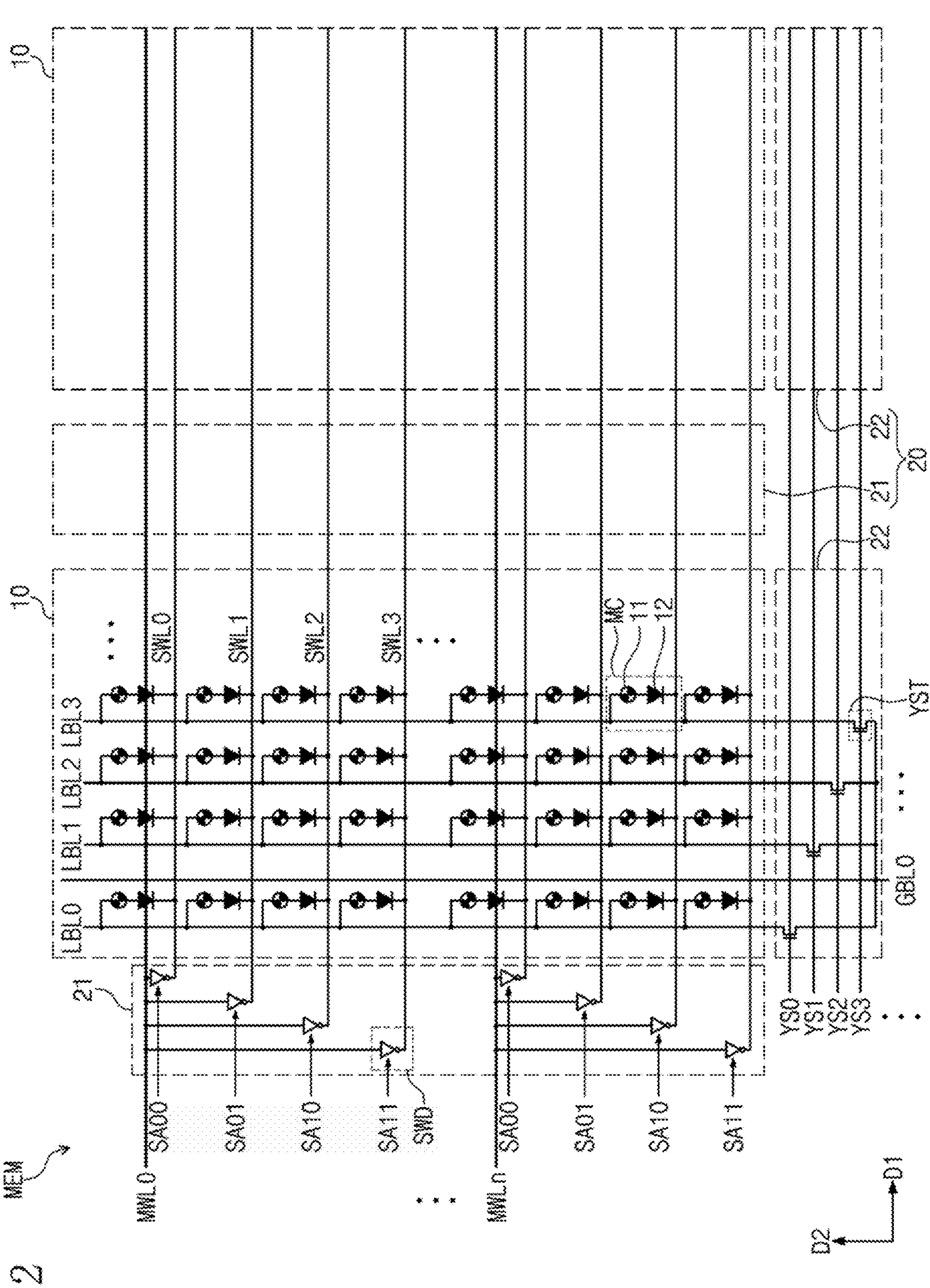
FIG. 2 is a schematic circuit diagram illustrating a memory region of a semiconductor memory device according to an example embodiment.

FIG. 2 is a schematic circuit diagram illustrating a memory region of a semiconductor memory device according to an example embodiment.

Referring to FIG. 2, the memory region MEM may include cell array regions 10 and core regions 20 near the cell array regions 10.

The word lines WL and the bit lines BL may be disposed in the cell array region 10. The memory cells MC may be respectively disposed at intersections or cross-points of the word and bit lines WL and BL. In an example embodiment, the memory cells MC may include a phase change material whose crystal structure or phase can be controlled by a current amount.

The core region 20 may include a WL-driver region 21, in which a WL driver SWD selecting the word lines WL is disposed, and a BL-selection region 22, in which BL-selection circuits YST for selecting the bit lines BL are disposed.

The cell array regions 10 may be two-dimensionally arranged. The core region 20 may be disposed between the cell array regions 10. In an example embodiment, the WL-driver region 21 may be disposed between the cell array regions 10, which are adjacent to each other in a first direction D1, and the BL-selection region 22 may be disposed between the cell array regions 10, which are adjacent to each other in a second direction D2.

In an example embodiment, each of the cell array regions 10 may include the word lines WL, the bit lines BL, and the memory cells MC. In an example embodiment, the word lines WL may have a hierarchical or multi-level word-line structure including a plurality of main word lines MWL and a plurality of sub-word lines SWL, as shown in the drawing. The bit lines BL may have a hierarchical or multi-level bit-line structure including a plurality of global bit lines GBL and a plurality of local bit lines LBL. The sub-word lines SWL may be selectively connected to one of the main word lines MWL through the WL drivers SWD. In addition, each of the local bit lines LBL may be selectively connected to one of the global bit lines GBL through the BL-selection circuit YST. In this structure, the memory cells MC may be located at or connected to cross-points of the sub-word lines SWL and the local bit lines LBL. In an example embodiment, each of the memory cells MC may include a variable resistance pattern 11 and a switching device 12. The variable resistance pattern 11 may be disposed between and connected to the local bit line LBL and the switching device 12. The switching device 12 may be disposed between and connected to the variable resistance pattern 11 and the sub-word line SWL.

The variable resistance pattern 11 may be formed of or include a material whose resistance can be switched to one of two different values by an electric pulse applied thereto. The description that follows will refer to an example in which the variable resistance pattern 11 includes a phase change material (e.g., Ge—Sb—Te (GST)) having a temperature-dependent resistance property. The phase change material may be a material whose crystalline structure or electric resistance can be reversibly switched to a highly-resistive or amorphous state and a lowly-resistive or crystallized state. The variable resistance pattern 11 may have a crystal structure that can be changed by an amount of current supplied through the local bit line LBL. For example, the phase change material of the variable resistance pattern 11 may be in an amorphous state if the phase change material is heated to a temperature that is higher than its melting temperature for a first interval of time by a current supplied thereto, and then is quickly quenched. When the phase change material is in the amorphous state, the memory cell MC may be in a 'RESET' state of storing data '1'. The phase change material may be in a crystallized state if the phase change material is heated to a temperature that is higher than its crystallization temperature and is lower than its melting temperature for a second interval of time longer than the first interval of time, and then is slowly cooled down. When the phase change material is in the crystallized state, the memory cell MC may be in a 'SET' state of storing data '0'. These states may be used to store data in the phase change material (e.g., by supplying the current) or to read out data from the memory cell (e.g., by measuring the resistance of the phase change material).

The variable resistance pattern 11 may be formed of a compound containing at least one of chalcogenide elements (e.g., Te, Se, and S) and at least one of, for example, Ge, Sb, Bi, Pb, Sn, Ag, As, Si, In, Ti, Ga, P, O, or C. For example, the variable resistance pattern 11 may be formed of or include at least one of binary compounds (e.g., GeTe, GeSe, GeS, SbSe, SbTe, SbS, SnSb, InSe, InSb, AsTe, AlTe, GaSb, AlSb, BiSb, ScSb, Ysb, CeSb, DySb, and NdSb), ternary compounds (e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS), quaternary compounds (e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeln, GeSbSeGa, GeSbSeAl, GeSbSeTI, GeSbSeSn, GeSbSeZn, GeSbTeIn, GeSbTeGa, GeSbTeAl, GeSbTeTI, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS), or quinary compounds (e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTI, GeScSbSeZn, GeScSbSeSn, GeScSbTeIn, GeScSbTeGa, GeSbAsTeAl, GeScSbTeTI, GeScSbTeZn, GeScSbTeSn, GeSbSeTeIn, GeSbSeTeGa, GeSbSeTeAl, GeSbSeTeTI, GeSbSeTeZn, GeSbSeTeSn, GeSbSeSIn, GeSbSeSGa, GeSbSeSAI, GeSbSeSTI, GeSbSeSZn, GeSbSeSSn, GeSbTeSIn, GeSbTeSGa, GeSbTeSAI, GeSbTeSTI, GeSbTeSZn, GeSbTeSSn, GeSbSeInGa, GeSbSeInAl, GeSbSeInTI, GeSbSeInZn, GeSbSeInSn, GeSbSeGaAl, GeSbSeGaTI, GeSbSeGaZn, GeSbSeGaSn, GeSbSeAlTI, GeSbSeAlZn, GeSbSeAlSn, GeSbSeTIZn, GeSbSeTISn, and GeSbSeZnSn). The variable resistance pattern 11 may be composed of a single layer containing one of the above compounds, but in an example embodiment, the variable resistance pattern 11 may be composed of a plurality of layers containing different compounds that are chosen from the above compounds but are different from each other. In an example embodiment, the variable resistance pattern 11 may have a super lattice structure, in which a germanium-containing layer and a germanium-free layer are repeatedly stacked. For example, the variable resistance pattern 11 may have a structure in which GeTe layers and $Sb_2Te_3$ layers are repeatedly stacked or GeTe layers and $Bi_2Te_3$ layers are repeatedly stacked. The variable resistance pattern 11 may be formed of or include a material in which at least one of B, C, N, O, P, Cd, W, Ti, Hf, or Zr is additionally added in at least one of the above compounds.

In an example embodiment, the switching device 12 may be a pn-junction diode. In the case where the switching device 12 is the pn-junction diode, an anode of the diode may be connected to the variable resistance pattern 11, and a cathode of the diode may be connected to the sub-word line SWL. Thus, in the case where a voltage difference between the anode and the cathode of the diode is larger than a threshold voltage of the diode, the diode may be turned on, and in this case, a current may be supplied to the variable resistance pattern 11.

In an example embodiment, the switching device 12 may be an ovonic threshold switch (OTS) device exhibiting a bi-directional property. For example, the switching device 12 may be or include a device exhibiting nonlinear I-V characteristics (e.g., an 'S'-shaped I-V curve), based on a threshold switching phenomenon. The switching device 12 may have a higher phase-transition temperature than the variable resistance pattern 11. The phase-transition temperature may be a temperature at which the crystal structure of the object (i.e., the switching device 12) is changed from crystal to amorphous or vice versa. For example, the phase-transition temperature of the switching device 12 may range from about 350° C. to about 450° C. Accordingly, during an operation of the device according to an example embodiment, it may be possible to reversibly change the crystal structure or phase of the variable resistance pattern 11 from the crystalline structure and the amorphous structure or vice versa, and to prevent the crystal structure of the switching device 12 from being changed from the amorphous structure. In the present specification, the substantially amorphous structure does not exclude a crystalline structure of an object, in which crystalline grains locally exist or a locally crystallized portion exists.

The switching device 12 may be formed of a compound containing at least one of chalcogenide elements (e.g., Te, Se, and S) and at least one of, for example, Ge, Sb, Bi, Al, Pb, Sn, Ag, As, Si, In, Ti, Ga, or P. For example, the switching device 12 may include at least one of binary compounds (e.g., GeSe, GeS, AsSe, AsTe, AaS SiTe, SiSe, SiS, GeAs, SiAs, SnSe, and SnTe), ternary compounds (e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe), quaternary compounds (e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeln, GeAsSeGa, GeAsSeAl, GeAsSeTI, GeAsSeSn, GeAsSeZn, GeAsTeIn, GeAsTeGa, GeAsTeAl, GeAsTeTI, GeAsTeSn, and GeAsTeZn), quinary compounds (e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeln, GeSiAsSeGa, GeSiAsSeAl, GeSiAsSeTI, GeSiAsSeZn, GeSiAsSeSn, GeSiAsTeIn, GeSiAsTeGa, GeSiAsTeAl, GeSiAsTeTI, GeSiAsTeZn, GeSiAsTeSn, GeAsSeTeIn, GeAsSeTeGa, GeAsSeTeAl, GeAsSeTeTI, GeAsSeTeZn, GeAsSeTeSn, GeAsSeSIn, GeAsSeSGa, GeAsSeSAI, GeAsSeSTI, GeAsSeSZn, GeAsSeSSn, GeAsTeSIn, GeAsTeSGa, GeAsTeSAI, GeAsTeSTI, GeAsTeSZn, GeAsTeSSn, GeAsSeInGa, GeAsSelnAl, GeAsSelnTI, GeAsSeInZn, GeAsSelnSn, GeAsSeGaAl, GeAsSeGaTI, GeAsSeGaZn, GeAsSeGaSn, GeAsSeAlTI, GeAsSeAlZn, GeAsSEAISn, GeAsSeTIZn, GeAsSeTISn, and GeAsSeZnSn), or senary compounds (e.g., GeSiAsSeTeS, GeSiAsSeTeIn, GeSiAsSeTeGa, GeSiAsSeTeAl, GeSiAsSeTeTI, GeSiAsSeTeZn, GeSiAsSeTeSn, GeSiAsSeTeP, GeSiAsSeSIn, GeSiAsSeSGa, GeSiAsSeSAI, GeSiAsSeSTI, GeSiAsSeSZn, GeSiAsSeSSn, GeAsSeTeSIn, GeAsSeTeSGa, GeAsSeTeSAI, GeAsSeTeSTI, GeAsSeTeSZn, GeAsSeTeSSn, GeAsSeTePIn, GeAsSeTePGa, GeAsSeTePAI, GeAsSeTePTI, GeAsSeTePZn, GeAsSeTePSn, GeSiAsSelnGa, GeSiAsSelnAl, GeSiAsSelnTI, GeSiAsSeInZn, GeSiAsSeInSn, GeSiAsSeGaAl, GeSiAsSeGaTI, GeSiAsSeGaZn, GeSiAsSeGaSn, GeSiAsSe AlSn, GeAsSeTeInGa, GeAsSeTeInAl, GeAsSeTeInTI, GeAsSeTeInZn, GeAsSeTeInSn, GeAsSeTeGaAl, GeAsSeTeGaTI, GeAsSeTeGaZn, GeAsSeTeGaSn, GeAsSeTeAlSn, GeAsSeSInGa, GeAsSeSInAl, GeAsSeSInTI, GeAsSeSInZn, GeAsSeSInSn, GeAsSeSGaAl, GeAsSeSGaTI, GeAsSeSGaZn, GeAsSeSGaSn, and GeAsSeSAISn). The switching device 12 may be composed of a single layer containing one of the above compounds, but in an example embodiment, the switching device 12 may be composed of a plurality of layers containing different compounds, which are chosen from the above compounds but are different from each other. The switching device 12 may be formed of or include a material in which at least one of B, C, N, or O is additionally added in at least one of the above compounds.

In an example embodiment, the WL drivers SWD, which connect one of the sub-word lines SWL to the main word line MWL in response to sub-word line selection signals SAi, may be disposed in the WL-driver region 21. The WL drivers SWD may include an inverter that is composed of MOS transistors. The main word lines MWL may be connected to the address decoder 31 of the peripheral circuit region PERI of FIG. 1.

In an example embodiment, the BL-selection circuits YST, which connect one of the local bit lines LBL to the global bit line GBL in response to the local bit line selection signals YSi, may be disposed in the BL-selection region 22. The BL-selection circuits YST may include MOS transistors. The global bit lines GBL may be connected to the address decoder 31 and the BL-selection unit 33 of the peripheral circuit region PERI (e.g., see FIG. 1). In the case where the bit lines have the hierarchical or multi-level structure including the global bit lines GBL and the local bit lines LBL, the local BL-selection circuits YST may be disposed in the BL-selection region 22.

In the case where the variable resistance pattern 11 includes a phase change material whose crystal state can be changed by a current amount, the WL drivers SWD and the BL-selection circuits YST disposed in the core region 20 may control a current amount provided to the memory cells MC. Thus, a current amount provided to the variable resistance patterns 11 may be controlled by driving performance of the transistors of the WL drivers SWD and the BL-selection circuits YST.

In the case where the WL drivers SWD and the BL-selection circuits YST are composed of the MOS transistors, a ratio of an area occupied by the MOS transistor and the interconnection structure connected thereto may be increased, because the MOS transistors are respectively connected to the sub-word lines SWL and the local bit lines LBL. Thus, an occupying area of the core region 20 in the semiconductor memory device may be larger than an occupying area of the cell array region 10. In this case, it may be difficult to increase an integration density of the semiconductor memory device. In addition, by increasing a size of the MOS transistor, it may be possible to improve the driving performance of the MOS transistors constituting the WL drivers SWD and the BL-selection circuits YST. However, the increase in size of the MOS transistor may lead to an increase in area of the core region 20, and this may make it difficult to increase an integration density of the semiconductor memory device. According to an example embodiment, by disposing the core region 20 below the cell array region 10, it may be possible to realize a highly-integrated semiconductor memory device. This will be described in more detail below.

Figure 3:
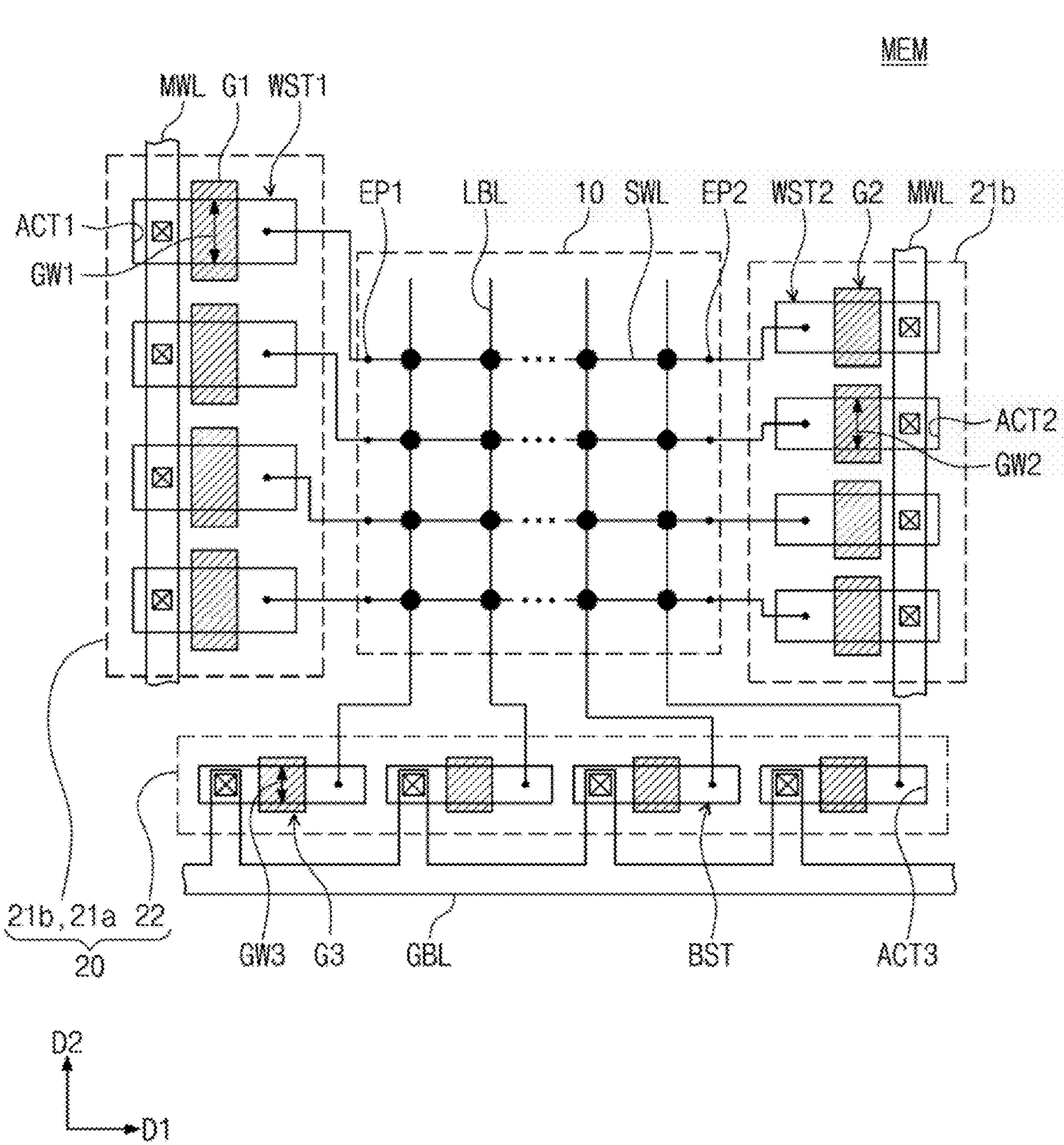
FIG. 3 is a circuit diagram illustrating a portion of a memory region of a semiconductor memory device according to an example embodiment.

FIG. 3 is a circuit diagram illustrating a portion of a memory region of a semiconductor memory device according to an example embodiment.

Referring to FIG. 3, the sub-word lines SWL and the local bit lines LBL may be disposed to cross each other in each of the cell array regions 10. The memory cells MC may be located at intersections or cross-points of the sub-word lines SWL and the local bit lines LBL. Each of the sub-word lines SWL may include a first end portion EP1 and a second end portion EP2, which are opposite to each other. The first end portions EP1 of the sub-word lines SWL may be connected to first WL-selection transistors WST1. The second end portions EP2 of the sub-word lines SWL may be connected to second WL-selection transistors WST2.

The first and second end portions EP1 and EP2 of each of the sub-word lines SWL may be applied with the same electrical signal (e.g., voltage or current) through the first and second WL-selection transistors WST1 and WST2. Thus, it may be possible to prevent or suppress an amount of voltage drop from being changed depending on a position in the sub-word line SWL.

The first WL-selection transistors WST1 may be disposed in a first WL-driver region 21*a*. The second WL-selection transistors WST2 may be disposed in a second WL-driver region 21*b*. In the present example embodiment, the total number of the first WL-selection transistors WST1 disposed in the first WL-driver region 21*a* may be equal to the total number of the second WL-selection transistors WST2 disposed in the second WL-driver region 21*b*. An area of the first WL-driver region 21*a* may be different from an area of the second WL-driver region 21*b*. For example, the area of the first WL-driver region 21*a* may be greater than the area of the second WL-driver region 21*b*.

Each of the first WL-selection transistors WST1 may include a first gate electrode G1 crossing a first active region ACT1. A first gate width GW1 of the first WL-selection transistor WST1 may correspond to a length of a portion of the first gate electrode G1 that overlaps the first active region ACT1, and is measured in a length direction of the first gate electrode G1 (e.g., the second direction D2 in the present example embodiment).

Each of the second WL-selection transistors WST2 may include a second gate electrode G2 crossing a second active region ACT2. A second gate width GW2 of the second WL-selection transistor WST2 may correspond to a length of a portion of the second gate electrode G2 that overlaps the second active region ACT2, and is measured in a length direction of a length direction of the second gate electrode G2 (e.g., the second direction D2).

In the present example embodiment, the first gate width GW1 may be different from the second gate width GW2. For example, the first gate width GW1 may be greater than the second gate width GW2.

In the present example embodiment, although the first gate width GW1 is different from the second gate width GW2, an effective gate width of the first WL-selection transistor WST1 may be substantially equal to an effective gate width of the second WL-selection transistor WST2. Thus, the first and second WL-selection transistors WST1 and WST2, which are connected to one of the first sub-word lines SWL, may apply the same electrical signal to the one of the first sub-word lines SWL.

The local bit lines LBL may be connected to BL-selection transistors BST. The BL-selection transistors BST may be disposed in the BL-selection region 22. The BL-selection transistors BST may include the local BL-selection circuits YST of FIG. 2. Each of the BL-selection transistors BST may include a third gate electrode G3 crossing a third active region ACT3. A third gate width GW3 of the BL-selection transistor BST may correspond to a length of a portion of the third gate electrode G3 that overlaps the third active region ACT3, and is measured in a length direction of the third gate electrode G3 (e.g., the second direction D2).

The third gate width GW3 may be different from at least one of the first and second gate widths GW1 and GW2. For example, the third gate width GW3 may be smaller than both of the first and second gate widths GW1 and GW2.

The BL-selection region 22, the first WL-driver region 21*a*, and the second WL-driver region 21*b* may constitute the core region 20.

An area of the BL-selection region 22 may be smaller than an area of at least one of the first and second WL-driver regions 21*a* and 21*b*.

Figure 4A:
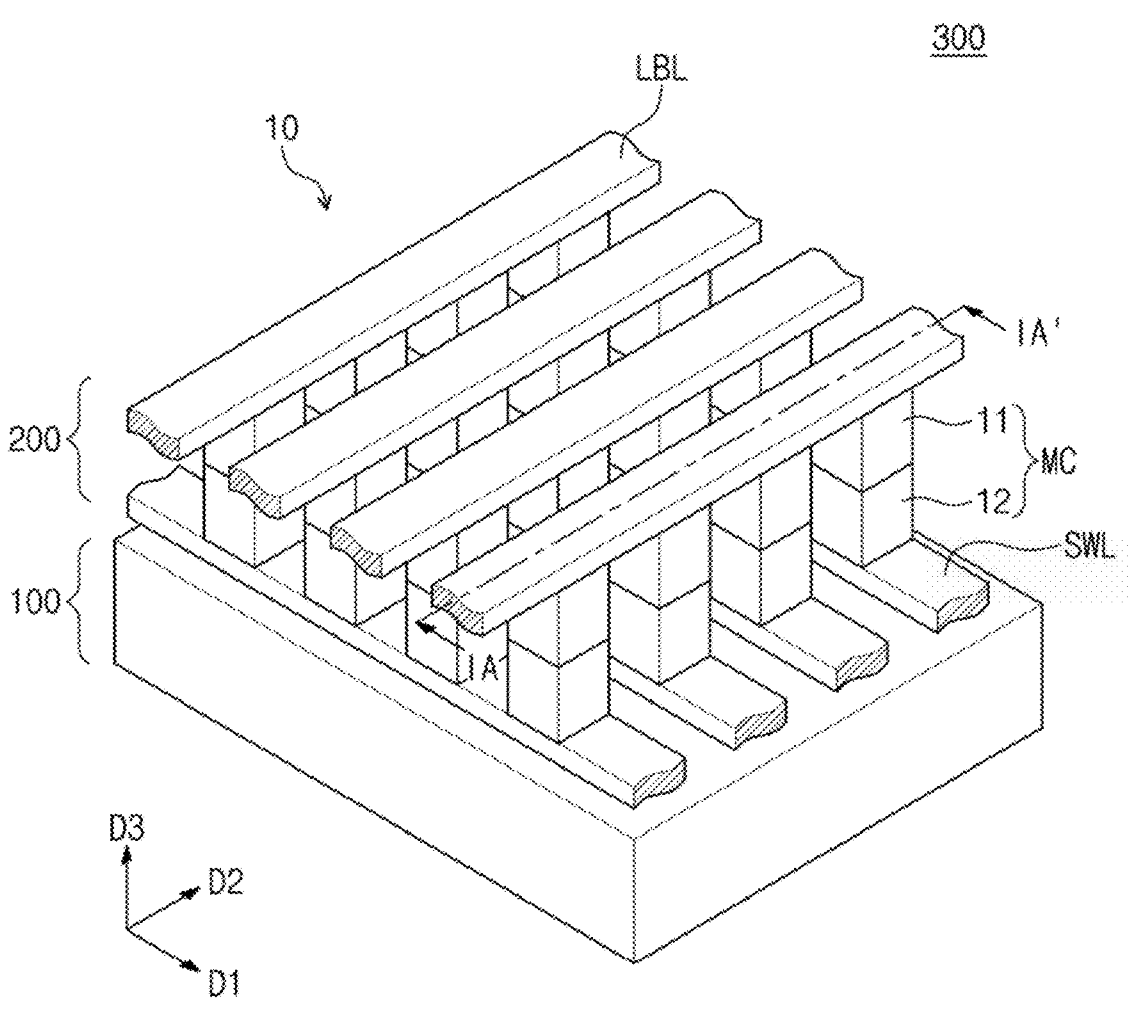
FIG. 4A is a perspective view illustrating a semiconductor memory device according to an example embodiment.
Figure 4B:
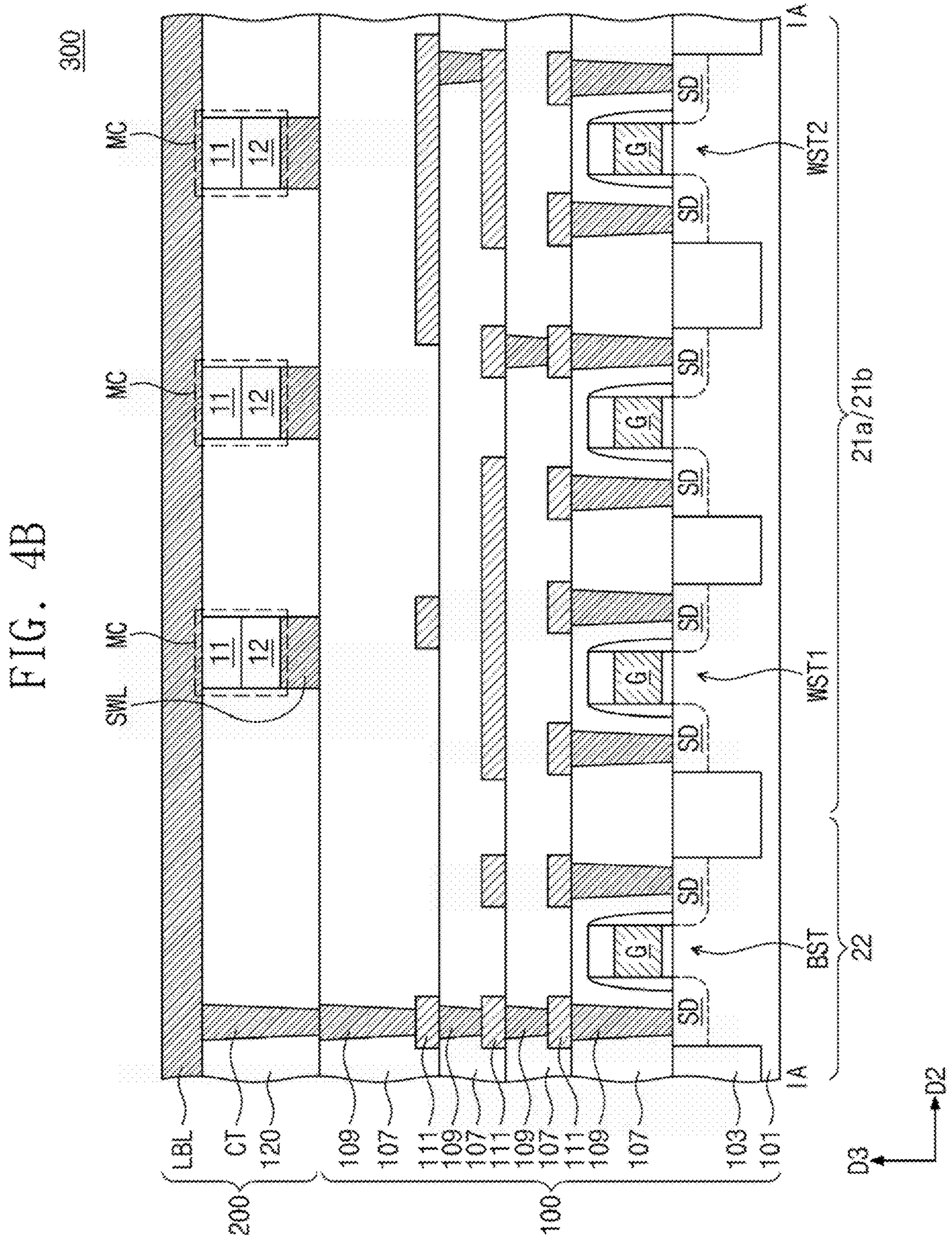
FIG. 4B is a sectional view taken along a line IA-IA' of FIG. 4A.

FIG. 4A is a perspective view illustrating a semiconductor memory device according to an example embodiment. FIG. 4B is a sectional view taken along a line IA-IA' of FIG. 4A.

Referring to FIGS. 4A and 4B, in a semiconductor memory device 300 according to the present example embodiment, a cell array portion 200 may be disposed on a peripheral circuit portion 100. The peripheral circuit portion 100 may include the peripheral circuit region PERI and the core regions 20 described with reference to FIGS. 1 to 3. Thus, the present example embodiment may provide increased integration density of the semiconductor memory device 300. The cell array portion 200 may include the cell array regions 10 described with reference to FIGS. 1 to 3.

The first and second WL-driver regions 21*a* and 21*b* of FIG. 3 may be overlapped with at least a portion of the sub-word lines SWL. The BL-selection region 22 of FIG. 3 may be overlapped with at least a portion of the local bit lines LBL. This will now be described in greater detail.

Referring to FIG. 4B, the peripheral circuit portion 100 may include a substrate 101, a device isolation layer 103, the selection transistors WST1, WST2, and BST, peripheral interlayer insulating layers 107, peripheral contacts 109, and peripheral interconnection lines 111.

The substrate 101 may be a semiconductor substrate that is formed of or includes a semiconductor material (e.g., silicon). The substrate 101 may be a single crystalline silicon substrate, a silicon epitaxial layer, or a silicon-on-insulator (SOI) substrate. The device isolation layer 103 may be disposed in the substrate 101 to define the active regions for the selection transistors WST1-WST4 and BST1-BST4. The device isolation layer 103 may be formed of or include at least one of silicon oxide or silicon nitride and may have a single- or multi-layered structure. The peripheral interlayer insulating layers 107 may be formed of or include at least one of silicon oxide, silicon nitride, silicon oxynitride, or porous insulating materials and may have a single- or multi-layered structure. The peripheral contacts 109 may be provided to penetrate the peripheral interlayer insulating layers 107, and may be connected to the peripheral interconnection lines 111. The peripheral contacts 109 and the peripheral interconnection lines 111 may be formed of or include a metal-containing layer (e.g., tungsten, copper, aluminum, titanium, tantalum, titanium nitride, or tantalum nitride).

The cell array portion 200 may include a cell interlayer insulating layer 120. The cell interlayer insulating layer 120 may fill spaces between the sub-word lines SWL and between the memory cells MC. Connection contacts CT may be provided to penetrate the cell interlayer insulating layer 120, and may be connected to a corresponding one of the peripheral contacts 109 or the peripheral interconnection lines 111. Some of the connection contacts CT may connect the BL-selection transistors BST to the local bit lines LBL. Others of the connection contacts CT may connect the WL-selection transistors WST1 and WST2 to the sub-word lines SWL.

Figure 5A:
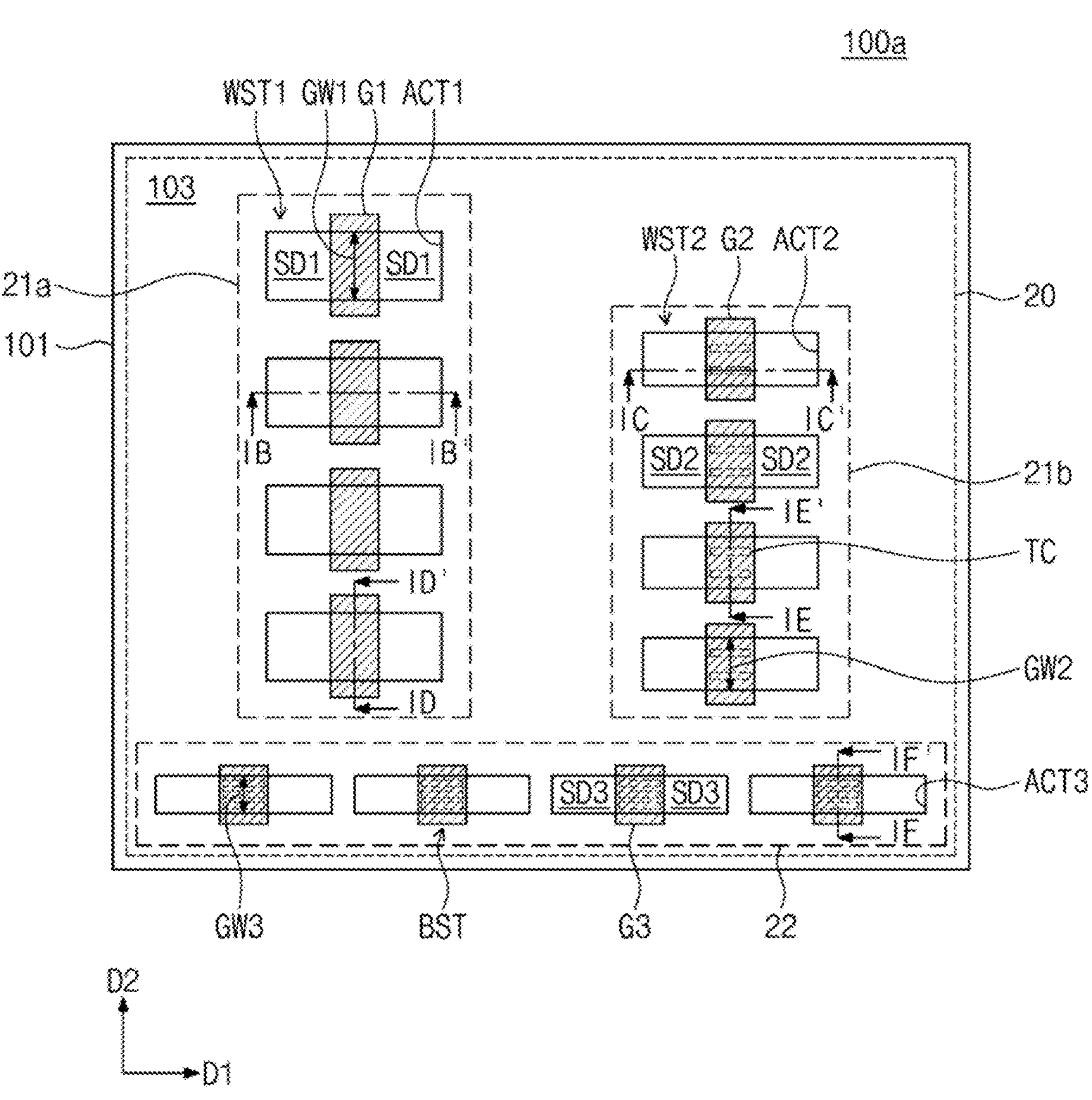
FIG. 5A is a plan view illustrating a peripheral circuit portion according to an example embodiment.
Figure 5B:
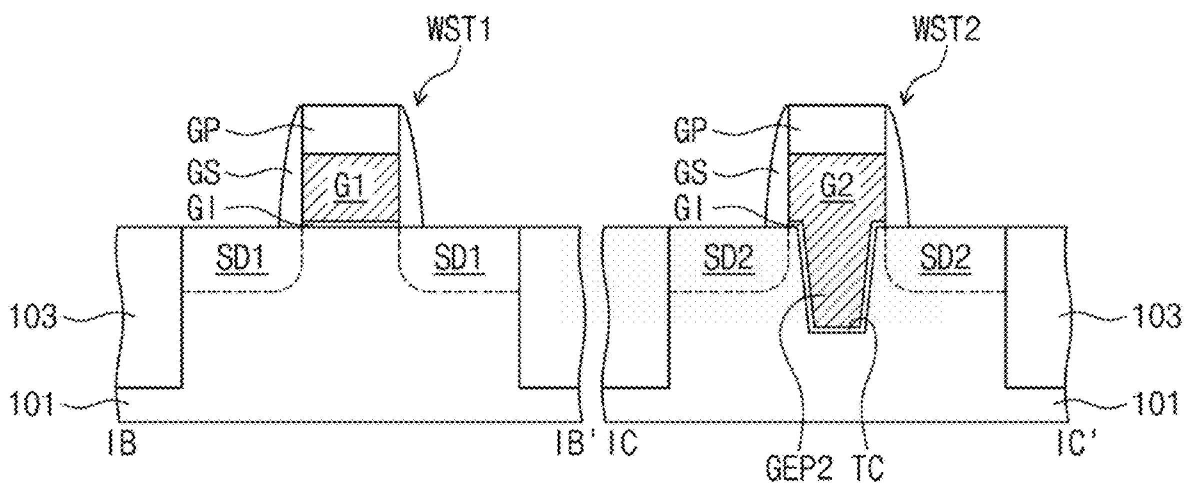
FIG. 5B is a sectional view taken along lines IB-IB' and IC-IC' of FIG. 5A.
Figure 5C:
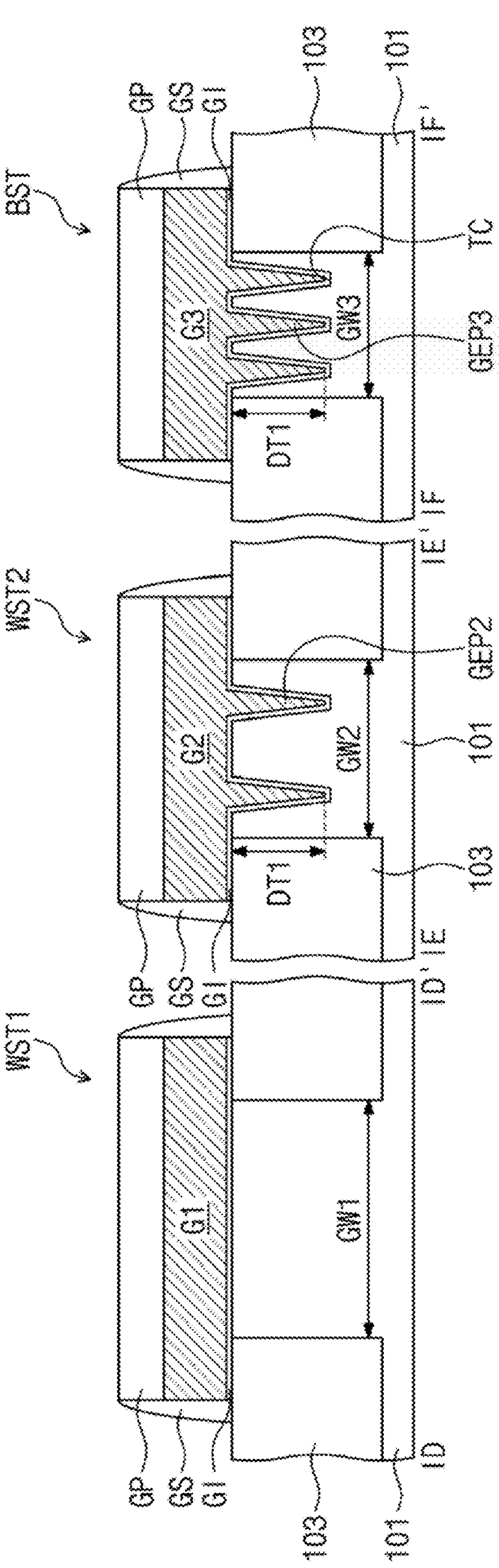
FIG. 5C is a sectional view taken along lines ID-ID', IE-IE', and IF-IF' of FIG. 5A.
Figure 5D:
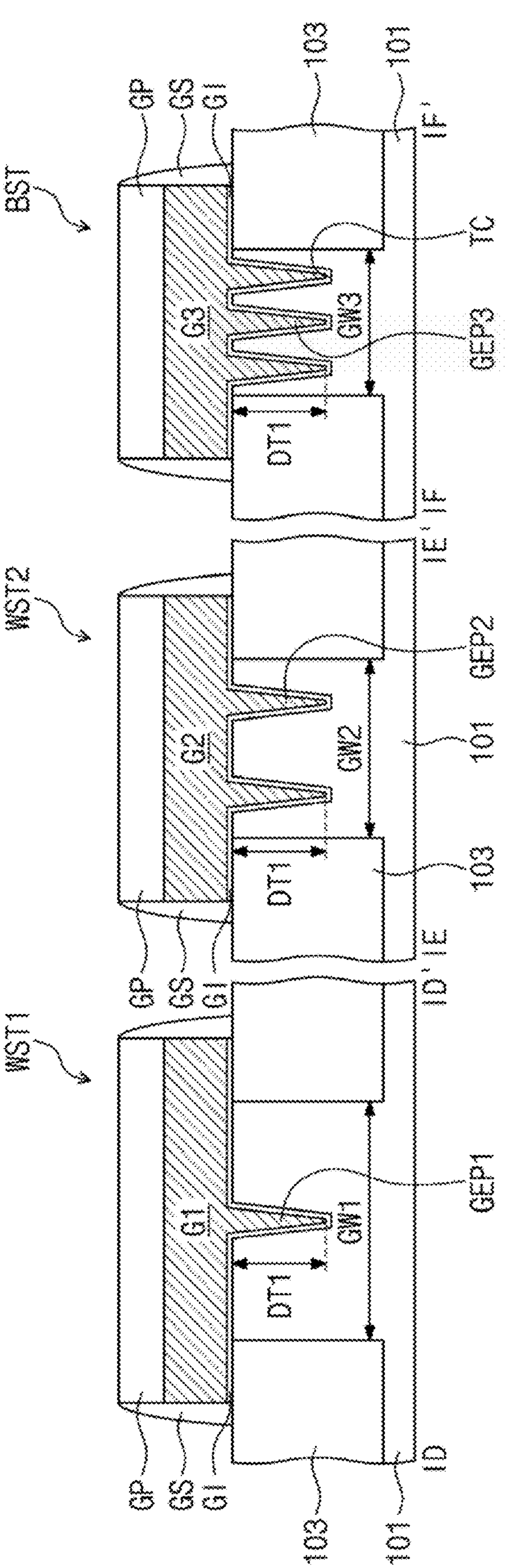
FIG. 5D is a sectional view taken along the lines ID-ID', IE-IE', and IF-IF' of FIG. 5A.

FIG. 5A is a plan view illustrating a peripheral circuit portion according to an example embodiment. FIG. 5B is a sectional view taken along lines IB-IB' and IC-IC' of FIG. 5A. FIG. 5C is a sectional view taken along lines ID-ID', IE-IE', and IF-IF' of FIG. 5A. FIG. 5D is a sectional view taken along the lines ID-ID', IE-IE', and IF-IF' of FIG. 5A.

Referring to FIGS. 5A to 5C, in the semiconductor memory device according to the present example embodiment, the core region 20 may be disposed in a peripheral circuit portion 100*a*. The core region 20 may include the first WL-driver region 21*a*, the second WL-driver region 21*b*, and the BL-selection region 22, which are spaced apart from each other. The first WL-selection transistors WST1, which are connected to the first end portions EP1 of the sub-word lines SWL of FIG. 3, may be disposed in the first WL-driver region 21*a*. The second WL-selection transistors WST2, which are connected to the second end portions EP2 of the sub-word lines SWL of FIG. 3, may be disposed in the second WL-driver region 21*b*. The BL-selection transistors BST, which are connected to the local bit lines LBL of FIG. 3, may be disposed in the BL-selection region 22.

The device isolation layer 103 may be disposed on the substrate 101 to delimit the first to third active regions ACT1, ACT2, and ACT3. The first WL-selection transistor WST1 may include the first gate electrode G1, which crosses the first active region ACT1 in the second direction D2, and first source/drain regions SD1, which are provided in two portions of the substrate 101 at both sides of the first gate electrode G1. The second WL-selection transistor WST2 may include the second gate electrode G2, which crosses the second active region ACT2 in the second direction D2, and second source/drain regions SD2, which are provided in two portions of the substrate 101 at both sides of the second gate electrode G2. The BL-selection transistor BST may include the third gate electrode G3, which crosses the third active region ACT3 in the second direction D2, and third source/drain regions SD3, which are provided in two portions of the substrate 101 at both sides of the third gate electrode G3.

A gate insulating layer GI may be interposed between the gate electrodes G1-G3 and the substrate 101. Each of side surfaces of the gate electrodes G1-G3 may be covered with a gate spacer GS. A top surface of each of the gate electrodes G1-G3 may be covered with a gate capping pattern GP. The gate insulating layer GI may be formed of or include at least one of silicon oxide, silicon nitride, or metal oxides, and may have a single- or multi-layered structure. Each of the gate spacer GS and the gate capping pattern GP may be formed of or include at least one of silicon oxide, silicon nitride, or silicon oxynitride, and may have a single- or multi-layered structure.

Each of the gate widths GW1-GW3 may correspond to an overlapping length between a corresponding one of the gate electrodes G1-G3 and a corresponding one of the active regions ACT1-ACT3, measured in a length direction of the corresponding one of the gate electrodes G1-G3 (e.g., in the second direction D2 in the present example embodiment). The length direction of the gate electrode may be perpendicular to a direction that connects opposite source/drain regions of the gate electrode.

The first gate width GW1 of the first WL-selection transistor WST1 may be greater than the second gate width GW2 of the second WL-selection transistor WST2. However, since the first WL-selection transistor WST1 has the same effective gate width as the second WL-selection transistor WST2, the second WL-selection transistor WST2 may exhibit substantially the same performance as the first WL-selection transistor WST1, even when the second WL-selection transistor WST2 has a smaller size than the first WL-selection transistor WST1. The 'effective gate width' may correspond to a length of a bottom surface of each of the gate electrodes G1-G3 overlapped with the substrate 101 or a corresponding one of the active regions ACT1-ACT3, measured in the length direction D2 of each of the gate electrodes G1-G3.

In an example embodiment, the bottom surface of the first gate electrode G1 may have a substantially flat shape. Each of the bottom surfaces of the second and third gate electrodes G2 and G3 may have an uneven shape. For example, a plurality of trenches TC may be formed in the substrate 1 and below the second and third gate electrodes G2 and G3, and the second and third gate electrodes G2 and G3 may include gate protruding portions GEP2 and GEP3, which respectively protrude into the trenches TC. The second gate electrode G2 may include a second gate protruding portion GEP2 protruding into the substrate 101. The third gate electrode G3 may include a third gate protruding portion GEP3 protruding into the substrate 101. A total number of the second gate protruding portions GEP2 may be smaller than a total number of the third gate protruding portions GEP3. Both of the gate protruding portions GEP2 and GEP3 may have the same depth DT1, when measured from a top surface of the substrate 101.

Even though the second gate width GW2 of the second gate electrode G2 is smaller than the first gate width GW1, the effective gate width of the second WL-selection transistor WST2 may be increased due to the presence of the second gate protruding portion GEP2. The number and depth of the second gate protruding portion GEP2 may be adjusted such that the second WL-selection transistor WST2 has substantially the same effective gate width as the first gate width GW1 of the first WL-selection transistor WST1. Thus, even when the second WL-selection transistor WST2 has a smaller size than the first WL-selection transistor WST1, the second WL-selection transistor WST2 may exhibit substantially the same performance as the first WL-selection transistor WST1.

In the case where the BL-selection transistor BST exhibits the same performance as the second WL-selection transistor WST2, a total number of the third gate protruding portions GEP3 may be greater than a total number of the second gate protruding portions GEP2 such that an effective gate width of the BL-selection transistor BST is equal to the effective gate width of the second WL-selection transistor WST2, even when the third gate width GW3 of the BL-selection transistor BST is smaller than the second gate width GW2 of the second WL-selection transistor WST2.

In the present example embodiment, the second gate width GW2 may be smaller than the first gate width GW1 and may be larger than the third gate width GW3, and both of the gate protruding portions GEP2 and GEP3 may have the same depth DT1. For the case in which all of the BL-selection transistor BST, the first WL-selection transistor WST1, and the second WL-selection transistor WST2 exhibit the same performance, a total number of the gate protruding portion GEP2 of the second WL-selection transistor WST2 may be greater than that of the first WL-selection transistor WST1 and may be smaller than that of the BL-selection transistor BST.

In another example embodiment, referring to FIG. 5D, the first gate electrode G1 may have a first gate protruding portion GEP1. A total number of the first gate protruding portions GEP1 may be smaller than a total number of the second gate protruding portions GEP2. Except for these differences, the semiconductor device according to the present example embodiment may be configured to have the same or similar features as the previous embodiment described with reference to FIG. 5C.

Figure 6A:
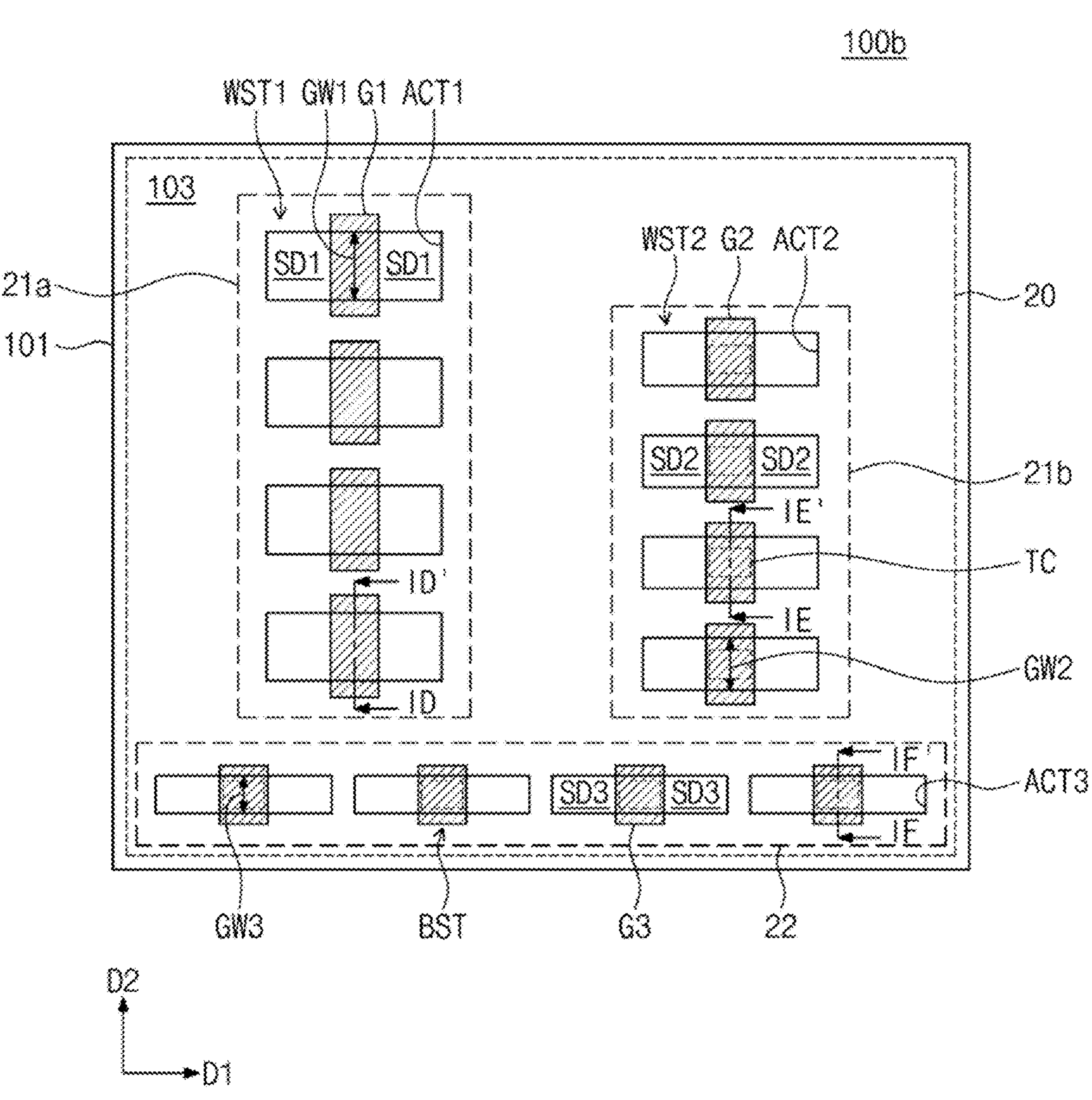
FIG. 6A is a plan view illustrating a peripheral circuit portion according to an example embodiment.
Figure 6B:
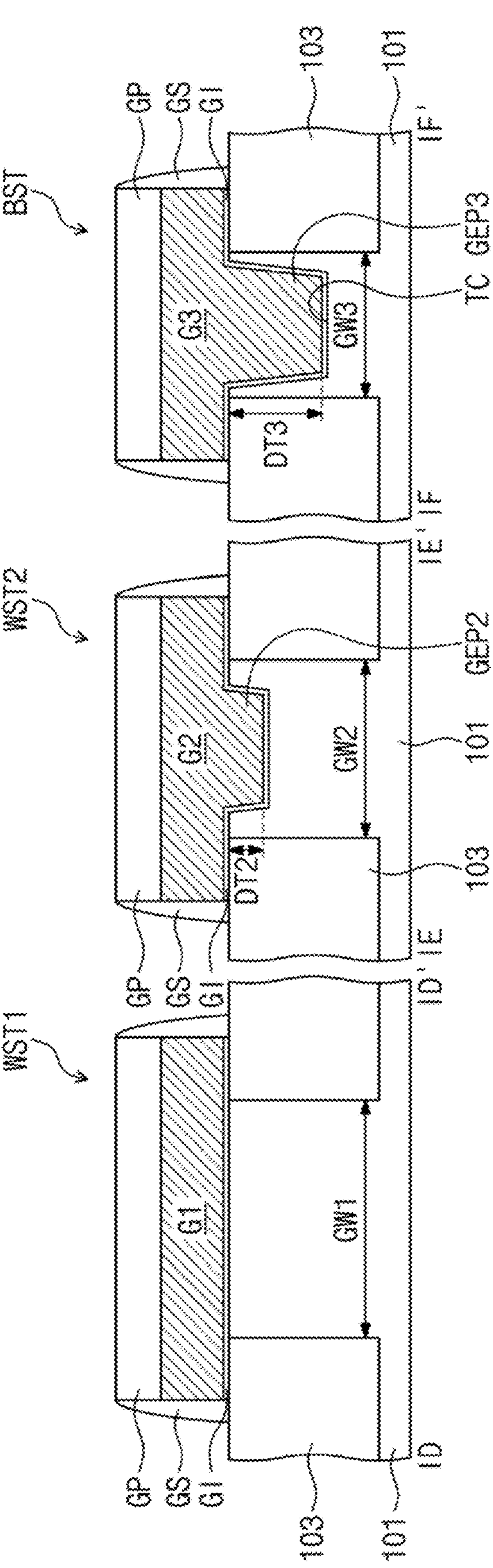
FIG. 6B is a sectional view taken along lines ID-ID', IE-IE', and IF-IF' of FIG. 6A.

FIG. 6A is a plan view illustrating a peripheral circuit portion according to an example embodiment. FIG. 6B is a sectional view taken along lines ID-ID', IE-IE', and IF-IF' of FIG. 6A.

Referring to FIGS. 6A and 6B, in a peripheral circuit portion 100*b* of the semiconductor memory device according to the present example embodiment, the second gate electrode G2 may have one second gate protruding portion GEP2. The third gate electrode G3 may have one third gate protruding portion GEP3. A bottom surface of the second gate protruding portion GEP2 may have a second depth DT2 from the top surface of the substrate 101. A bottom surface of the third gate protruding portion GEP3 may have a third depth DT3 from the top surface of the substrate 101. The third depth DT3 may be larger than the second depth DT2.

For the case where the BL-selection transistor BST exhibits the same performance as the second WL-selection transistor WST2, the third depth DT3 may be larger than the second depth DT2 such that the BL-selection transistor BST has substantially the same effective gate width as the second WL-selection transistor WST2, even when the third gate width GW3 of the BL-selection transistor BST is smaller than the second gate width GW2 of the second WL-selection transistor WST2. Except for these differences, the semiconductor device according to the present example embodiment may be configured to have the same or similar features as the previous embodiment described with reference to FIG. 5C.

Figure 7A:
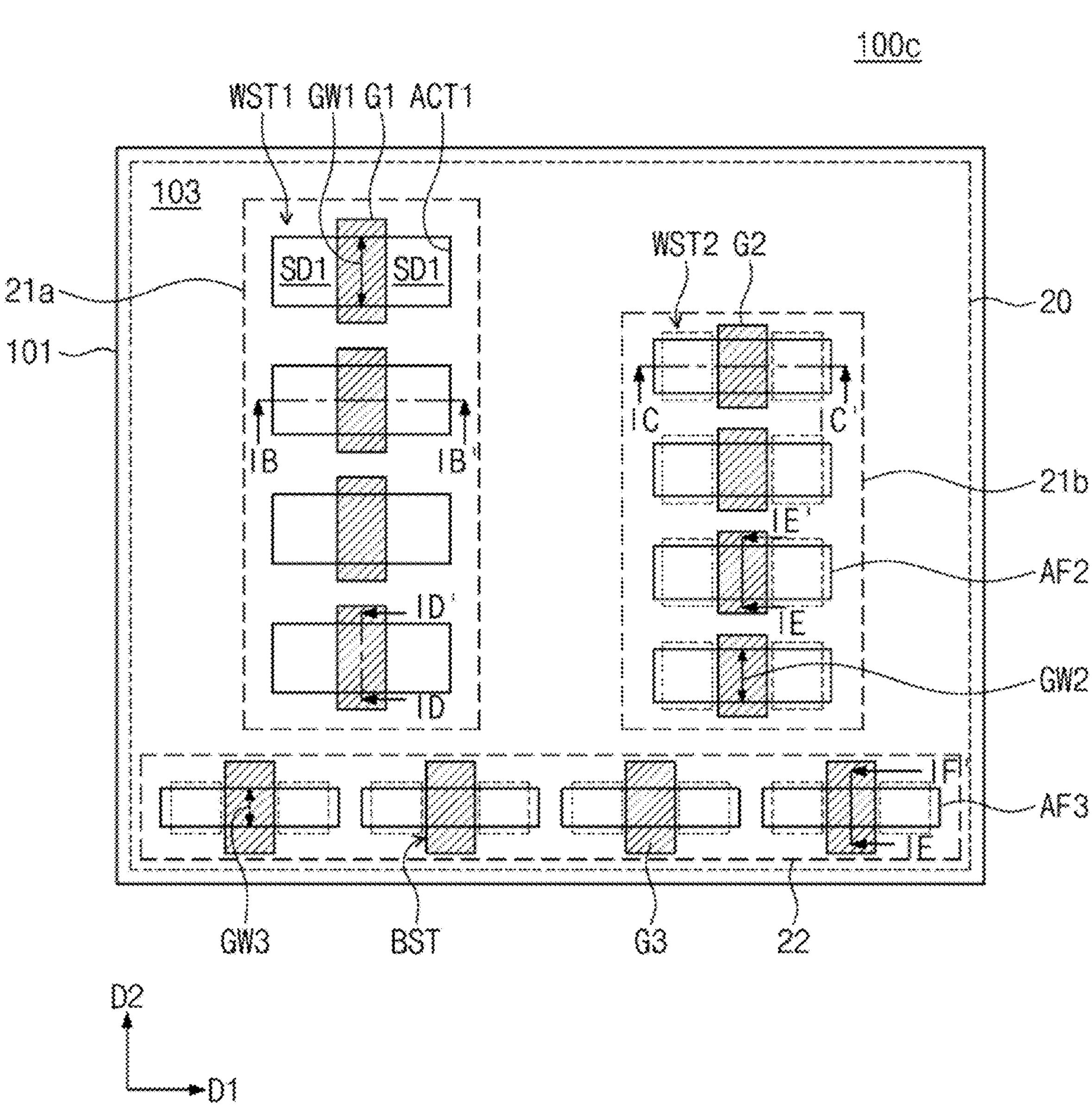
FIG. 7A is a plan view illustrating a peripheral circuit portion according to an example embodiment.
Figure 7B:
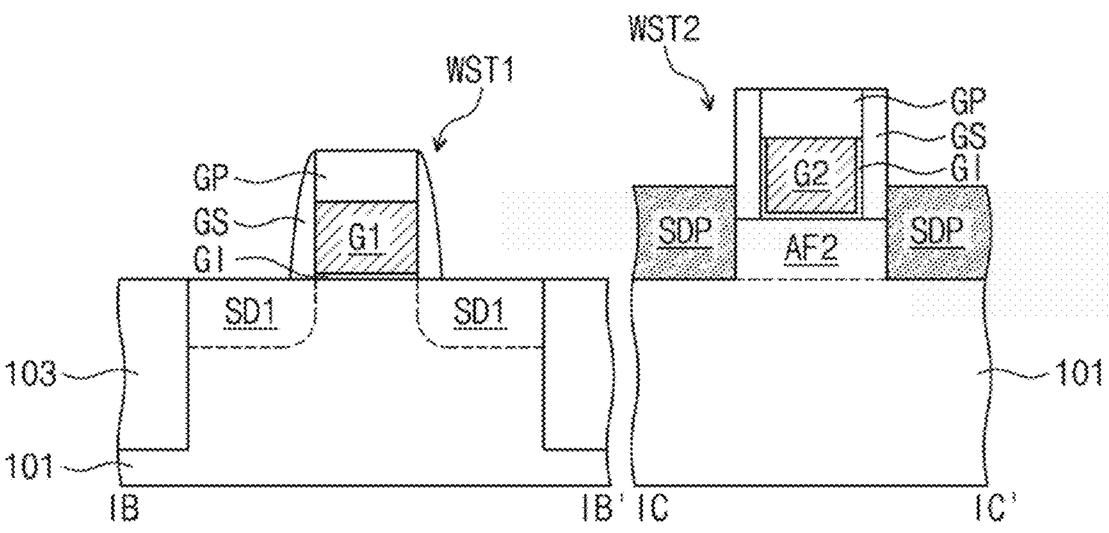
FIG. 7B is a sectional view taken along lines IB-IB' and IC-IC' of FIG. 7A.
Figure 7C:
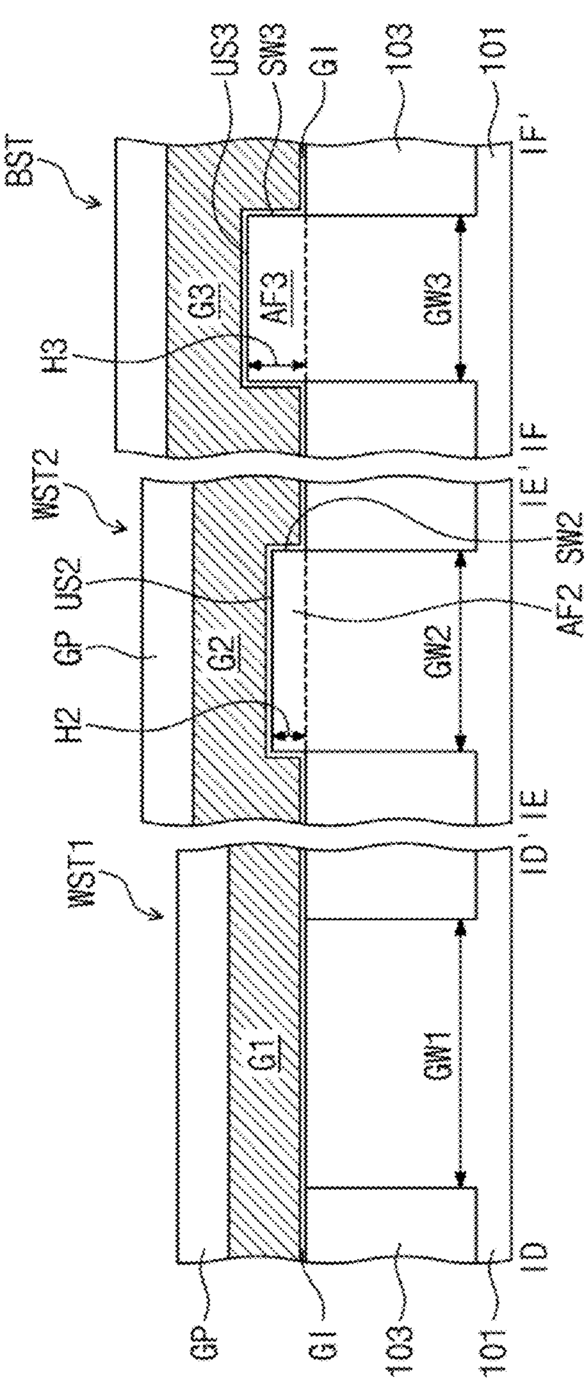
FIG. 7C is a sectional view taken along lines ID-ID', IE-IE', and IF-IF' of FIG. 7A.

FIG. 7A is a plan view illustrating a peripheral circuit portion according to an example embodiment. FIG. 7B is a sectional view taken along lines IB-IB' and IC-IC' of FIG. 7A. FIG. 7C is a sectional view taken along lines ID-ID', IE-IE', and IF-IF' of FIG. 7A.

Referring to FIGS. 7A to 7C, in a peripheral circuit portion 100*c* of the semiconductor memory device according to the present example embodiment, a portion of the substrate 101 below the second gate electrode G2 may constitute a second active fin AF2 protruding toward the second gate electrode G2, and a portion of the substrate 101 below the third gate electrode G3 may constitute a third active fin AF3 protruding toward the third gate electrode G3. Each of the second and third active fins AF2 and AF3 may protrude above a top surface of the device isolation layer 103.

The second gate electrode G2 may cross the second active fin AF2. Source/drain patterns SDP may be disposed on two opposite portions of the substrate 101 alongside the second active fin AF2, to be located at opposite sides of the second gate electrode G2. The third gate electrode G3 may cross the third active fin AF3. The source/drain patterns SDP may also be disposed on two opposite portions of the substrate 101 at the second active fin AF2, to be located at opposite sides of the third gate electrode G3. The first WL-selection transistor WST1 may be a planar-type MOS transistor. The second WL-selection transistor WST2 and the BL-selection transistor BST may have the FinFET structure.

In the present example embodiment, each of the second WL-selection transistors WST2 may be configured such that a total number of the second active fin AF2 is one and a width of the second active fin AF2 is equal to the second gate width GW2. In addition, each of the BL-selection transistors BST may be configured such that a total number of the third active fin AF3 is one and a width of the third active fin AF3 is equal to the third gate width GW3. The second gate width GW2 may be greater than the third gate width GW3. The first WL-selection transistor WST1 may be configured to have the same or similar features as that of FIG. 5C.

The second gate electrode G2 may cover a second top surface US2 and second side surfaces SW2 of the second active fin AF2. The second side surface SW2 may be aligned to a side surface of the device isolation layer 103. The second top surface US2 may have a second height H2 from the top surface of the substrate 101 or the device isolation layer 103.

The third gate electrode G3 may cover a third top surface US3 and third side surfaces SW3 of the third active fin AF3. The third side surface SW3 may be aligned to a side surface of the device isolation layer 103. The third top surface US3 may have a third height H3 from the top surface of the substrate 101 or the device isolation layer 103. The third height H3 may be larger than the second height H2.

The effective gate width of the second WL-selection transistor WST2 may be equal to a first value, which is obtained by adding two times a length of the second side surface SW2 to a length of the second top surface US2. For the case in which the second WL-selection transistor WST2 exhibits the same performance as the first WL-selection transistor WST1, the first value may be substantially equal to the first gate width GW1. The effective gate width of the BL-selection transistor BST may be equal to a second value, which is obtained by adding two times a length of the third side surface SW3 to a length of the third top surface US3. For the case in which the BL-selection transistor BST exhibits the same performance as the first WL-selection transistor WST1, the second value may be substantially equal to the first gate width GW1. Except for these differences, the semiconductor device according to the present example embodiment may be configured to have the same or similar features as the previous embodiment described with reference to FIG. 5C.

Figure 8A:
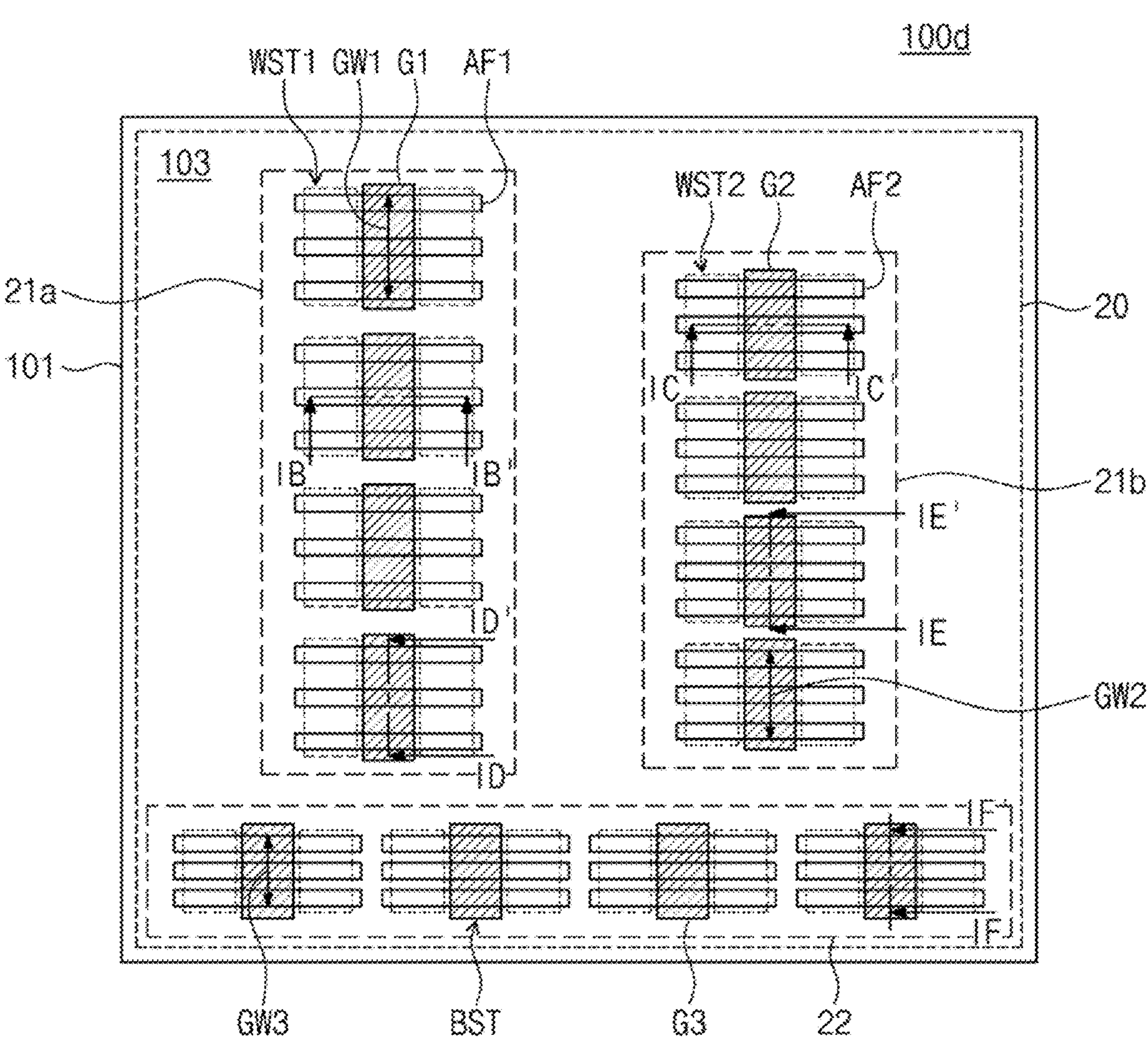
FIG. 8A is a plan view illustrating a peripheral circuit portion according to an example embodiment.
Figure 8B:
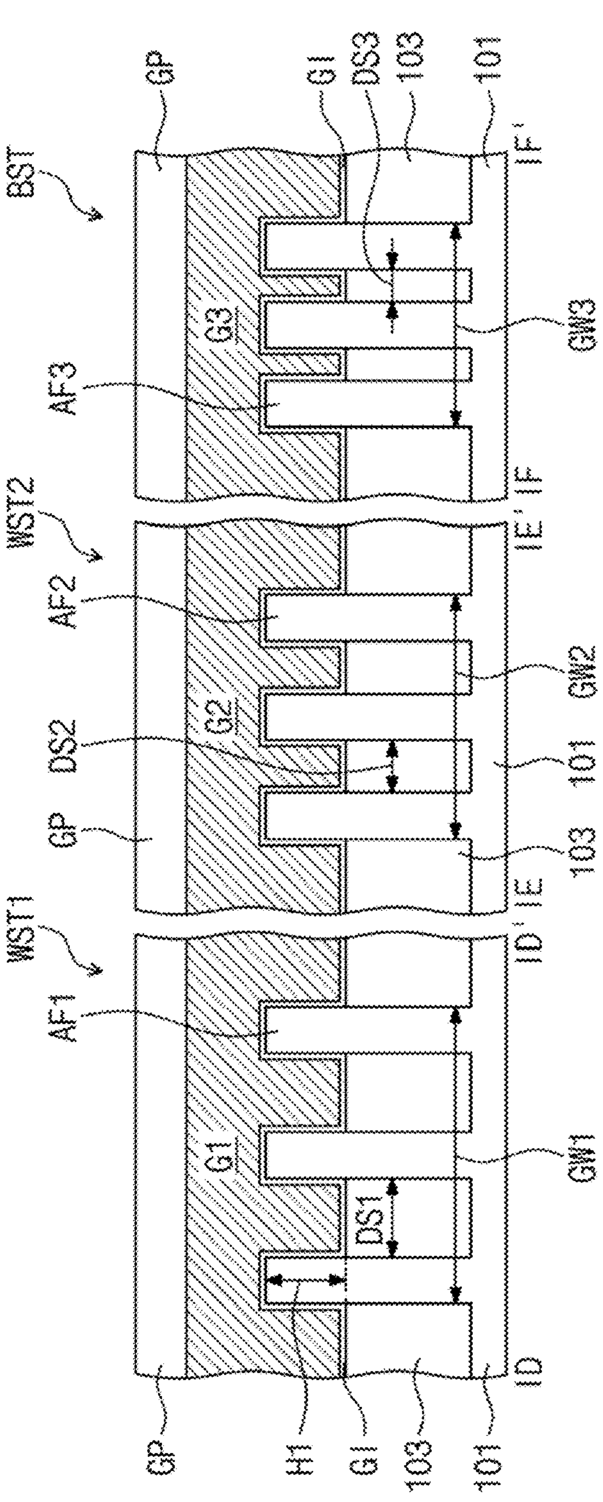
FIG. 8B is a sectional view taken along lines ID-ID', IE-IE', and IF-IF' of FIG. 8A.

FIG. 8A is a plan view illustrating a peripheral circuit portion according to an example embodiment. FIG. 8B is a sectional view taken along lines ID-ID', IE-IE', and IF-IF' of FIG. 8A. Sections taken along lines IB-IB' and IC-IC' of FIG. 8A may be the same or similar as the IC-IC' section of FIG. 7B.

Referring to FIGS. 8A and 8B, in a peripheral circuit portion 100*d* of the semiconductor memory device according to the present example embodiment, all of the first WL-selection transistor WST1, the second WL-selection transistor WST2, and the BL-selection transistor BST may have the FinFET structure. For example, the first gate electrode G1 of the first WL-selection transistor WST1 may be provided to cross three first active fins AF1. The second gate electrode G2 of the second WL-selection transistor WST2 may be provided to cross three second active fins AF2. The third gate electrode G3 of the BL-selection transistor BST may be provided to cross three third active fins AF3. All of top surfaces of the first to third active fins AF1-AF3 may be located at a first height H1, from the top surface of the substrate 101 or the device isolation layer 103. The first to third active fins AF1-AF3 may have the same width. The effective gate width of each of the selection transistors WST1, WST2, and BST may correspond to a value that is given by multiplying a value, which is obtained by adding two times a length of a side surface of each of the active fins AF1-AF3 to a length of its top surface, by the number of the active fins AF1-AF3. Since the first to third active fins AF1-AF3 are the same in terms of their widths, height, and number, the selection transistors WST1, WST2, and BST may have substantially the same effective gate width. Thus, the selection transistors WST1, WST2, and BST may exhibit the same performance.

A distance between opposite side surfaces of the leftmost and rightmost ones of the first active fins AF1 may correspond to the first gate width GW1. The first active fins AF1 may be spaced apart from each other by a first distance DS1. A distance between opposite side surfaces of the leftmost and rightmost ones of the second active fins AF2 may correspond to the second gate width GW2. The second active fins AF2 may be spaced apart from each other by a second distance DS2. A distance between opposite side surfaces of the leftmost and rightmost ones of the third active fins AF3 may correspond to the third gate width GW3. The third active fins AF3 may be spaced apart from each other by a third distance DS3. The second gate width GW2 may be smaller than the first gate width GW1, and may be larger than the third gate width GW3. For example, the second distance DS2 may be smaller than the first distance DS1, and may be larger than the distance DS3.

The gate insulating layer GI may be interposed between the second gate electrode G2 and the second active fin AF2, and between the second gate electrode G2 and the gate spacer GS. Although not shown, the gate insulating layer GI may be interposed between the third gate electrode G3 and the third active fin AF3, and between the third gate electrode G3 and the gate spacer GS. Except for these differences, the semiconductor device according to the present example embodiment may be configured to have the same or similar features as the previous example embodiments.

Figure 9A:
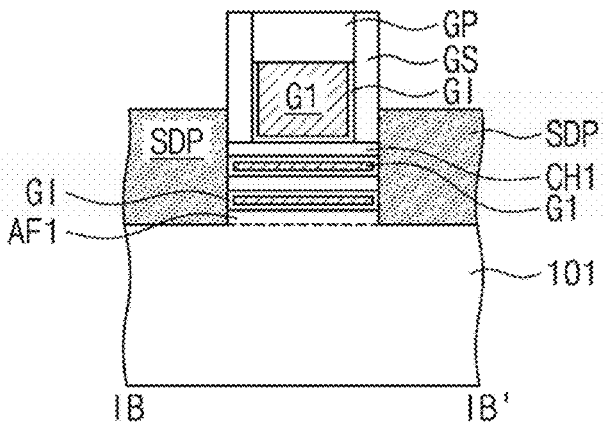
FIG. 9A is a section view taken along a line IB-IB' of FIG. 8A.
Figure 9B:
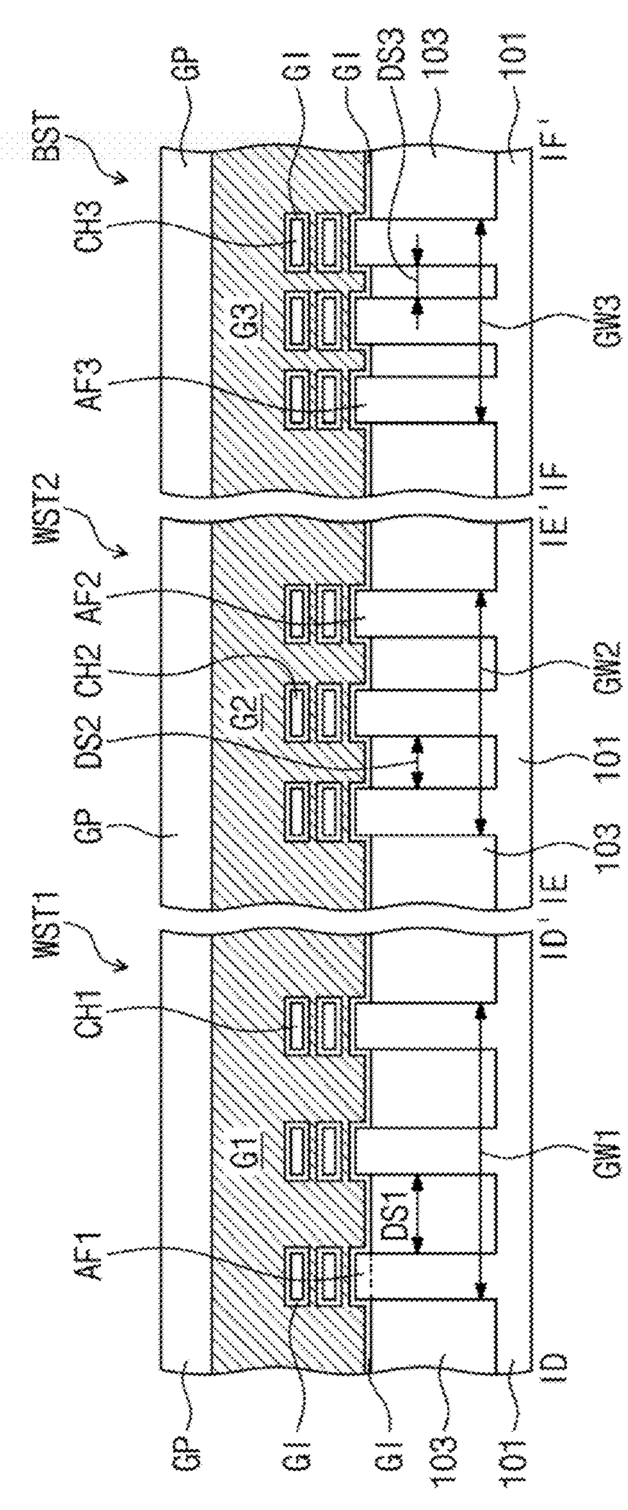
FIG. 9B is a sectional view taken along the lines ID-ID', IE-IE', and IF-IF' of FIG. 8A.

FIG. 9A is a section view taken along a line IB-IB' of FIG. 8A. In an example embodiment, the section taken along the line IC-IC' of FIG. 8A may be the same or similar to the structure illustrated in FIG. 9A. FIG. 9B is a sectional view taken along the lines ID-ID', IE-IE', and IF-IF' of FIG. 8A.

Referring to FIGS. 9A and 9B, all of the first WL-selection transistor WST1, the second WL-selection transistor WST2, and the BL-selection transistor BST may have a multi-bridge channel field effect transistor (MBCFET) structure.

For example, first channel patterns CH1 may be stacked on the first active fin AF1 to be spaced apart from each other. A portion of the first gate electrode G1 may be interposed between the first channel patterns CH1, and between the first channel patterns CH1 and the first active fin AF1. The gate insulating layer GI may be interposed between the first gate electrode G1 and the first channel patterns CH1, and between the first gate electrode G1 and the first active fin AF1.

Similarly, second channel patterns CH2 may be stacked on the second active fin AF2 to be spaced apart from each other. A portion of the second gate electrode G2 may be interposed between the second channel patterns CH2, and between the second channel pattern, CH2 and the second active fin AF2. Third channel patterns CH3 may be stacked on the third active fin AF3 to be spaced apart from each other. A portion of the third gate electrode G3 may be interposed between the third channel patterns CH3, and between the third channel pattern CH3 and the third active fin AF3. In the present example embodiment, a total number of the channel patterns CH1-CH3 stacked on each of the active fins AF1-AF3 may be two, but example embodiments are not limited thereto.

The channel patterns CH1-CH3 may be formed of or include a semiconductor material (e.g., silicon). Widths of the channel patterns CH1-CH3 may be substantially equal to widths of the active fins AF1-AF3, respectively. The channel patterns CH1-CH3 may be the same in their distance, height, and width.

In the present example embodiment, the effective gate width of each of the selection transistors WST1, WST2, and BST may correspond to a value, which is obtained by summing lengths of side and top surfaces of a corresponding active fin and circumference lengths of corresponding channel patterns CH1-CH3. Since the channel patterns CH1-CH3 have the same height and width and the active fins AF1-AF3 have the same height and width, the selection transistors WST1, WST2, and BST may exhibit the same performance. Except for these differences, the semiconductor device according to the present example embodiment may be configured to have the same or similar features as the previous embodiment described with reference to FIG. 8B.

Figure 10A:
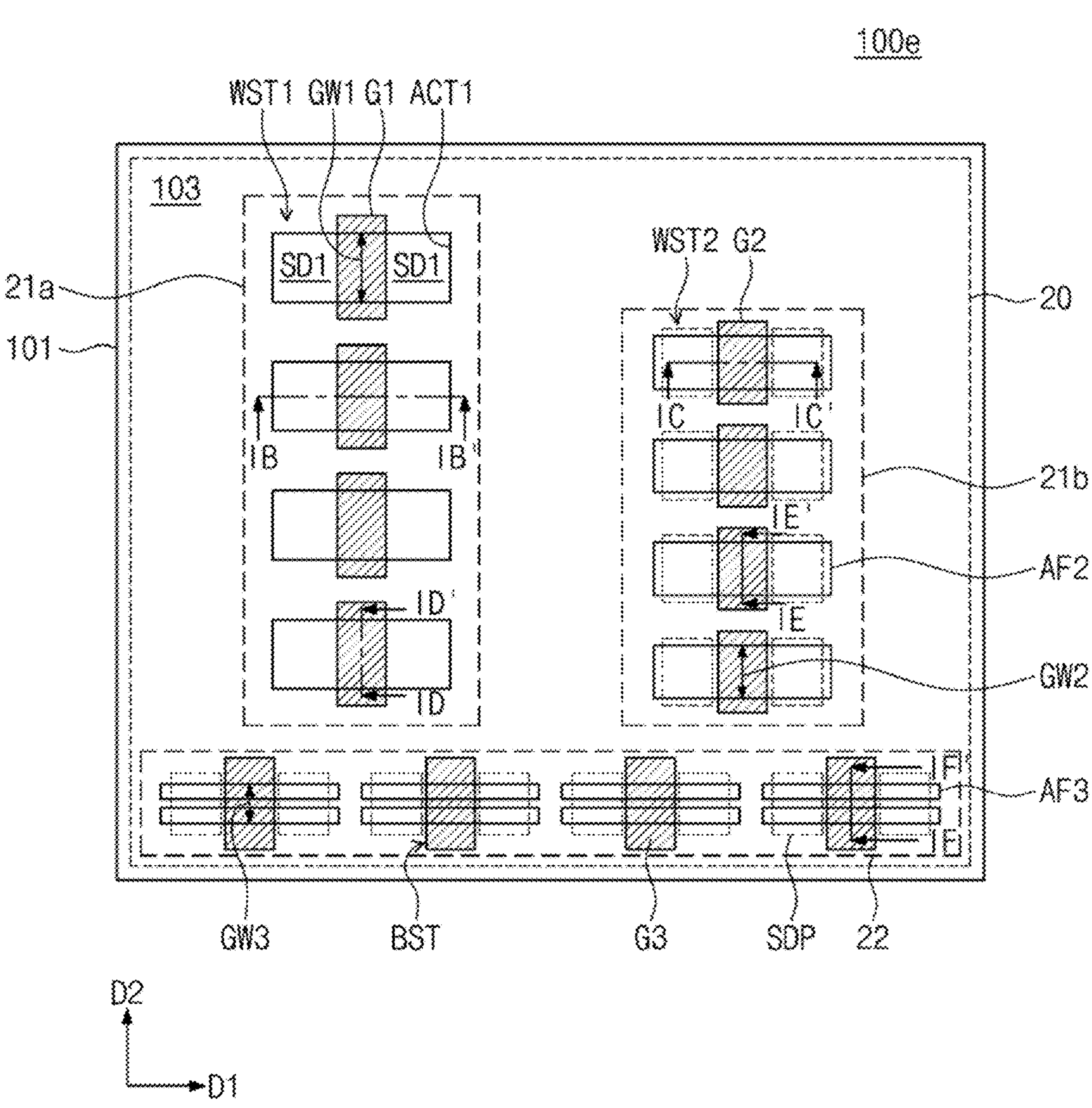
FIG. 10A is a plan view illustrating a peripheral circuit portion according to an example embodiment.
Figure 10B:
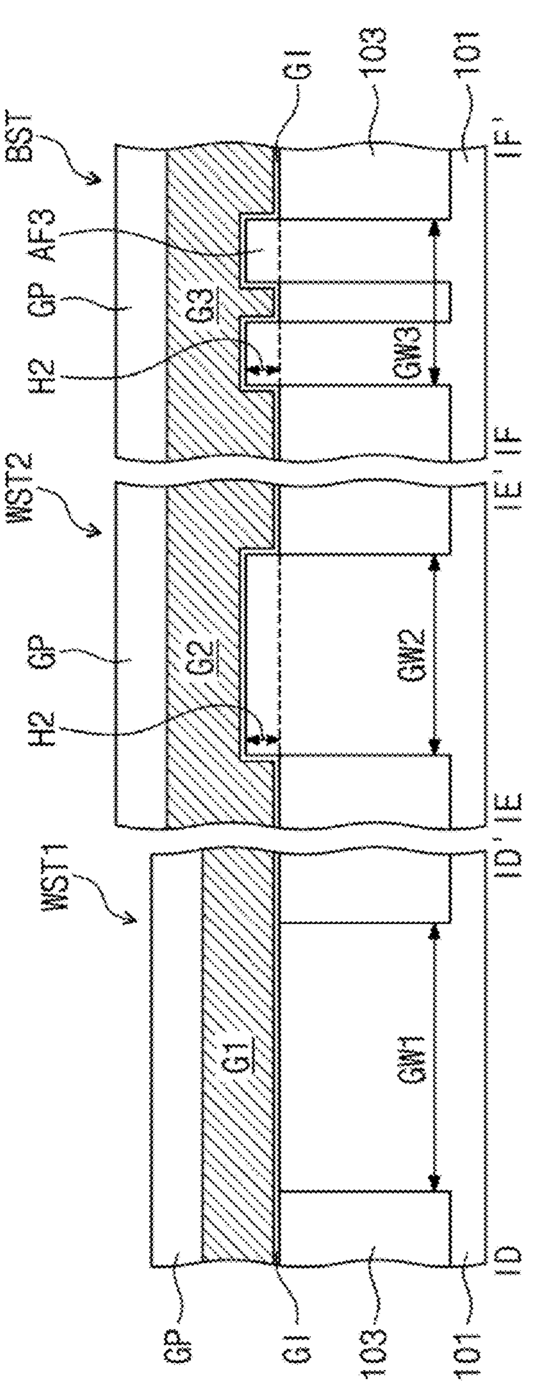
FIGS. 10B to 10D are sectional views, each of which illustrates sections taken along lines ID-ID', IE-IE' and IF-IF' of FIG. 10A.
Figure 10C:
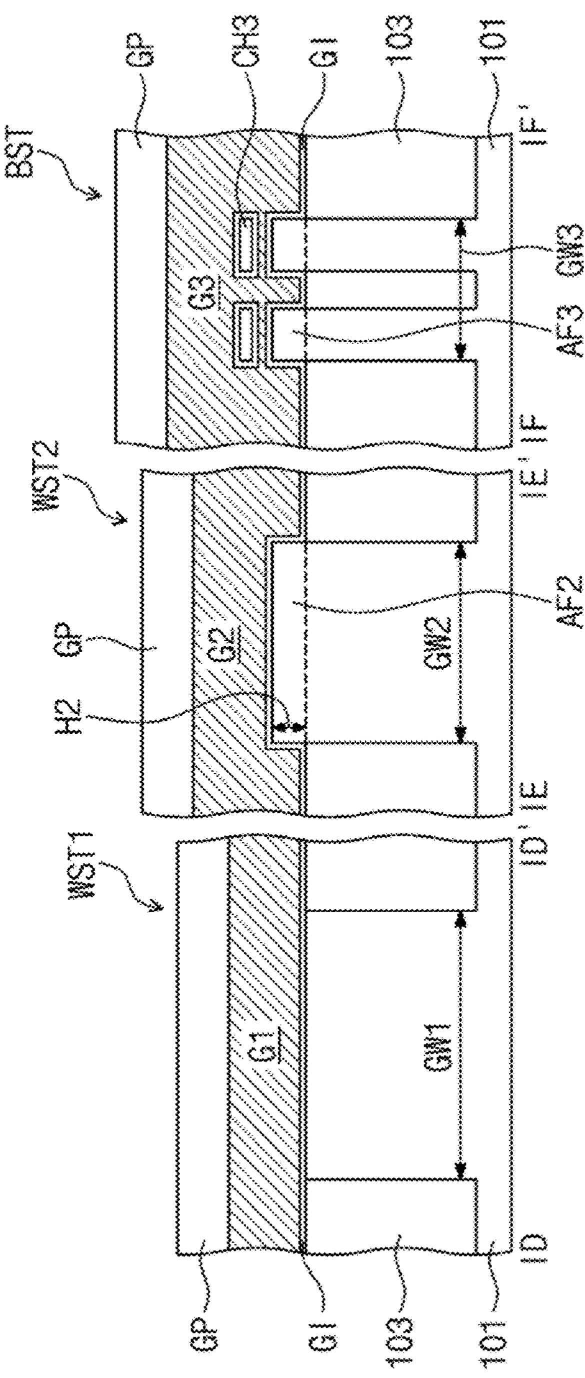
Figure 10D:
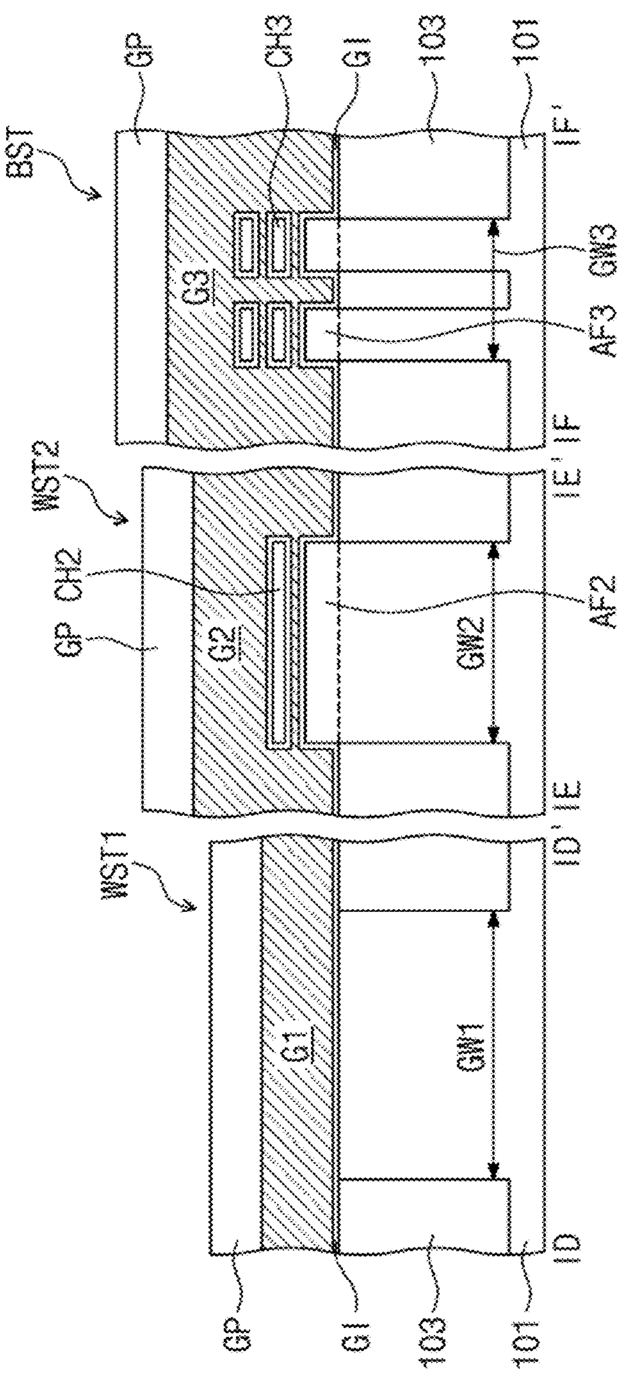

FIG. 10A is a plan view illustrating a peripheral circuit portion according to an example embodiment. FIGS. 10B to 10D are sectional views, each of which illustrates sections taken along lines ID-ID', IE-IE' and IF-IF' of FIG. 10A. The section taken along the line IB-IB' of FIG. 8A may be the same or similar as the IB-IB' section of FIG. 7B. The section taken along the line IC-IC' of FIG. 8A may be the same or similar as the IC-IC' section of FIG. 7B or the IB-IB' section of FIG. 9A.

Referring to FIGS. 10A and 10B, in a peripheral circuit portion 100*e* of the semiconductor memory device according to the present example embodiment, the first WL-selection transistor WST1 may be the planar-type transistor, and both of the second WL-selection transistor WST2 and the BL-selection transistor BST may have the Fin Field Effect Transistor (FinFET) structure. The second WL-selection transistor WST2 may have one second active fin AF2. The BL-selection transistor BST may have a pair of the third active fins AF3. The height H2 of the second active fin AF2 from the top surface of the device isolation layer 103 may be substantially equal to the heights H2 of the third active fins AF3 from the top surface of the device isolation layer 103. The width GW2 of the second active fin AF2 may correspond to the second gate width GW2. A distance between opposite side surfaces of the left and right ones of the third active fins AF3 may correspond to the third gate width GW3. A width AW3 of the third active fin AF3 may be smaller than the width GW2 of the second active fin AF2. In this case, a total number of the third active fins AF3 may be greater than a total number of the second active fins AF2. Thus, the BL-selection transistor BST may have the same effective gate width as the second WL-selection transistor WST2.

Referring to FIG. 10C, the first WL-selection transistor WST1 may be a planar-type transistor, the second WL-selection transistor WST2 may be a FinFET, and the BL-selection transistor BST may be an MBCFET. Except for these differences, the semiconductor device according to the present example embodiment may be configured to have the same or similar features as the previous example embodiments. Thus, the BL-selection transistor BST may further include the third channel pattern CH3, which is disposed on the third active fin AF3, and the third gate electrode G3 may be interposed between the third channel pattern CH3 and the third active fin AF3.

Referring to FIG. 10D, the first WL-selection transistor WST1 may be a planar-type transistor, and the second WL-selection transistor WST2 and the BL-selection transistor BST may have the MBCFET structure. The second WL-selection transistor WST2 may further include the second channel pattern CH2 provided as a single layer on the second active fin AF2. The width GW2 of the second channel pattern CH2 may be equal to the width GW2 of the second active fin AF2. The BL-selection transistor BST may further include the third channel patterns CH3, which are stacked as two layers on the third active fin AF3. A width of the third channel pattern CH3 may be equal to a width of the third active fin AF3 and may be smaller than a width of the second channel pattern CH2. A total number of the third channel patterns CH3 stacked on each of the third active fins AF3 may be greater than a total number of the second channel patterns CH2 stacked on each of the second active fins AF2. Thus, even when the gate width GW3 has a relatively small value, it may be possible to realize the same effective gate width.

The relationship between the selection transistors WST1, WST2, and BST or between the regions 21*a*, 21*b*, and 22 described with reference to FIGS. 3 to 10C may be changed or combined with each other. For example, the third gate width GW3 of the BL-selection transistor BST may have the largest value, and one of the first and second gate widths GW1 and GW2 of the WL-selection transistors WST1 and WST2 may have the smallest value.

According to an example embodiment, by using three-dimensional transistors (e.g., the transistor with the gate protruding portions, the FinFETs, and the MBCFETs) as described with reference to FIGS. 3 to 10C, it may be possible to reduce planar sizes of transistors and to diminish a difference between the effective gate widths of the transistors, and thus, the transistors may be designed to exhibit the same performance (e.g., in voltage and/or current characteristics). Accordingly, each of the regions 21*a*, 21*b*, and 22 may be provided to have a relatively reduced area, compared with the conventional cases, and thus, it may be possible to realize a highly-integrated semiconductor memory device, without deterioration in performance.

Figure 11:
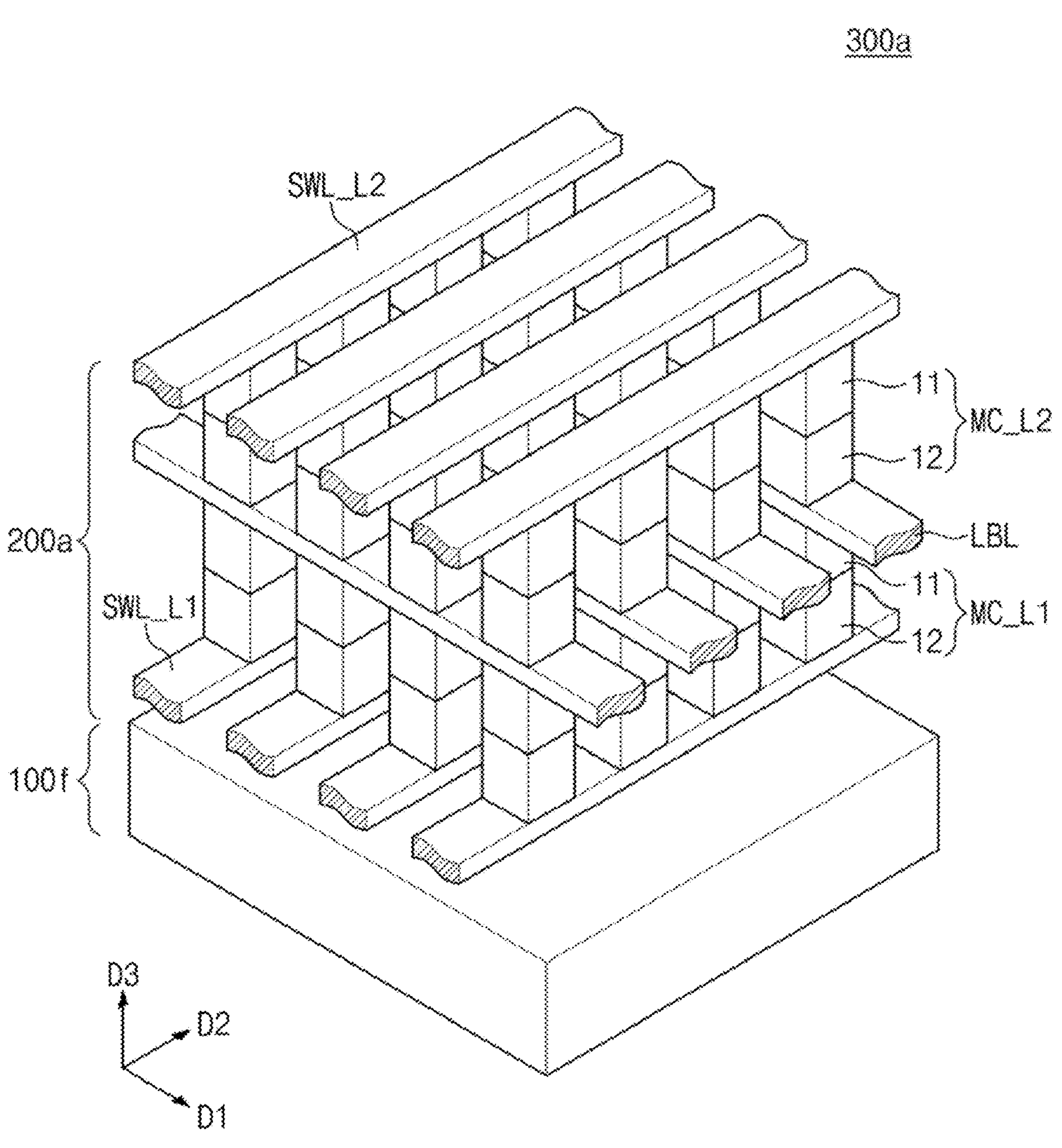
FIG. 11 is a perspective view illustrating a semiconductor memory device according to an example embodiment.

FIG. 11 is a perspective view illustrating a semiconductor memory device according to an example embodiment. FIG. 12 is a perspective view illustrating a connection structure between a cell array portion and a peripheral circuit portion of FIG. 11. FIGS. 13A to 13D are plan views, each of which illustrates a peripheral circuit portion according to an example embodiment.

Referring to FIGS. 11 to 13D, in a semiconductor memory device 300*a* according to the present example embodiment, a cell array portion 200*a* may be disposed on a peripheral circuit portion 100*f*. The cell array portion 200*a* may include first-level sub-word lines SWL_L1, first-level memory cells MC_L1, local bit lines LBL, second-level memory cells MC_L2, and second-level sub-word lines SWL_L2, which are sequentially stacked.

A core region 20*a* may be disposed in the peripheral circuit portion 100*f*. The core region 20*a* may include a BL-selection region 22, a (1-2)-th level WL-driver region 21*a*_L2, a (1-1)-th level WL-driver region 21*a*_L1, a (2-2)-th level WL-driver region 21*b*_L2, and a (2-1)-th level WL-driver region 21*b*_L1. The BL-selection region 22 may have a long shape that is elongated in the first direction D1 and may cross the local bit lines LBL. The BL-selection region 22 may be spaced apart from the (1-2)-th level WL-driver region 21*a*_L2, the (1-1)-th level WL-driver region 21*a*_L1, the (2-2)-th level WL-driver region 21*b*_L2, and the (2-1)-th level WL-driver region 21*b*_L1 in the second direction D2.

The (1-2)-th level WL-driver region 21*a*_L2, the (1-1)-th level WL-driver region 21*a*_L1, the (2-2)-th level WL-driver region 21*b*_L2, and the (2-1)-th level WL-driver region 21*b*_L1 may be arranged side by side in the first direction D1 and may constitute a single WL driver group. Two WL driver groups may be spaced apart from each other in the second direction D2, with the BL-selection region 22 interposed therebetween.

First end portions EP1_L1 and second end portions EP2_L1 of the first-level sub-word lines SWL_L1 may be respectively connected to the (1-1)-th level WL-driver region 21*a*_L1 (or the (1-1)-th level WL-selection transistors therein) and to the (2-1)-th level WL-driver region 21*b*_L1 (or the (2-1)-th level WL-selection transistors therein) through first-level WL-connection contacts CTW_L1. First end portions EP1_L2 and second end portions EP2_L2 of the second-level sub-word lines SWL_L2 may be respectively connected to the (1-2)-th level WL-driver region 21*a*_L2 (or the (1-2)-th level WL-selection transistors therein) and to the (2-2)-th level WL-driver region 21*b*_L2 (or the (2-2)-th level WL-selection transistors therein) through second-level WL-connection contacts CTW_L2. Intermediate points of the local bit lines LBL may be connected to the BL-selection region 22 through bit line connection contacts CTB, respectively.

The BL-selection transistors BST may be disposed in the BL-selection region 22. The first WL-selection transistors WST1 may be disposed in the (1-1)-th level WL-driver region 21*a*_L1 and the (1-2)-th level WL-driver region 21*a*_L2. The second WL-selection transistors WST2 may be disposed in the (2-1)-th and (2-2)-th level WL-driver regions 21*b*_L1 and 21*b*_L2. Each of the BL-selection transistor BST, the first WL-selection transistor WST1, and the second WL-selection transistor WST2 may be independently configured to have the same structure as one of the selection transistors WST1, WST2, and BST described with reference to FIGS. 3 to 10C.

Referring to FIGS. 13A to 13D, the BL-selection region 22, the (1-2)-th level WL-driver region 21*a*_L2, the (1-1)-th level WL-driver region 21*a*_L1, the (2-2)-th level WL-driver region 21*b*_L2, and the (2-1)-th level WL-driver region 21*b*_L1 may have the same area or may have different areas.

Figure 13A:
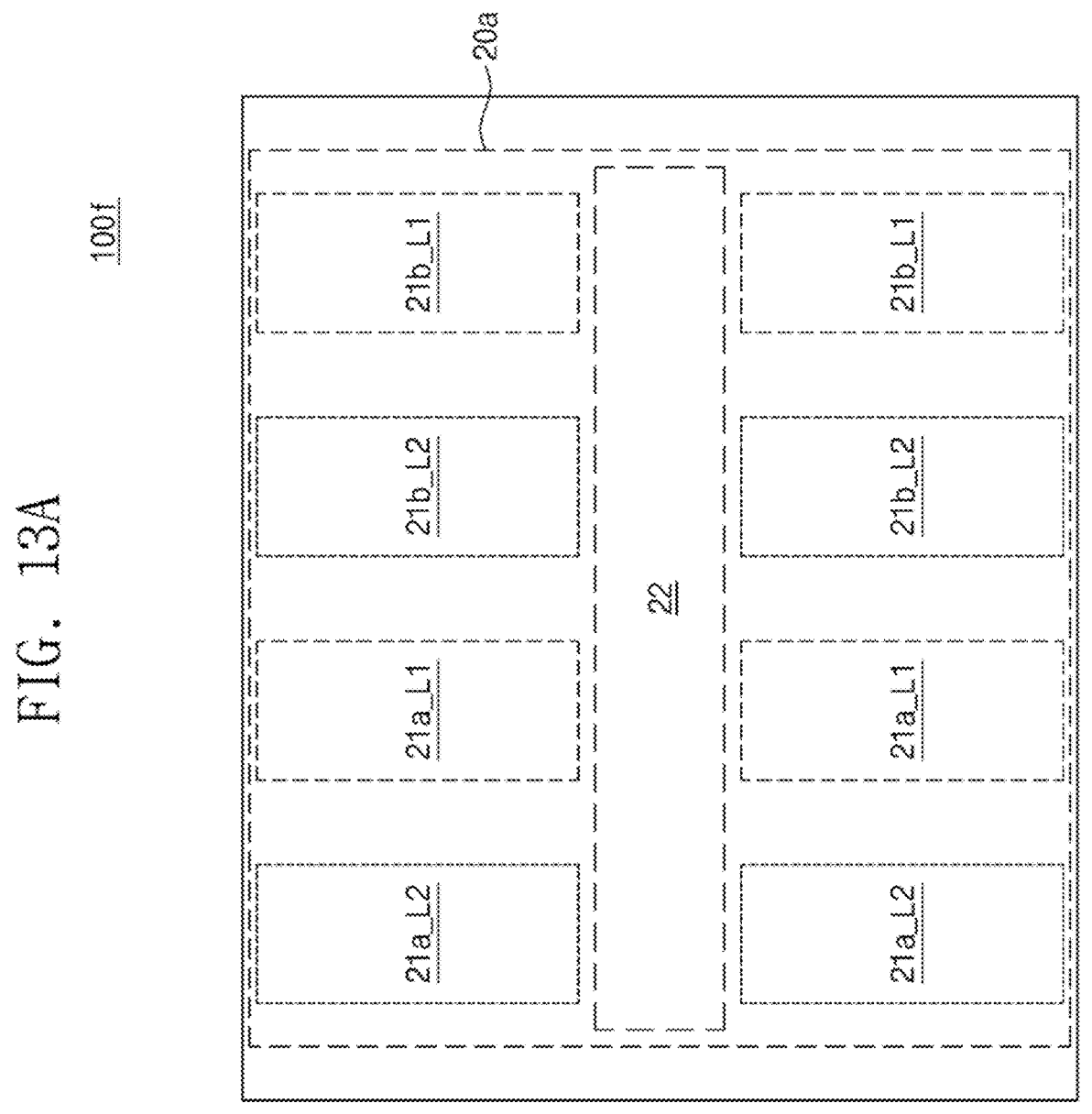

For example, as shown in FIG. 13D, the (1-1)-th and (2-1)-th level WL-driver regions 21*a*_L1 and 21*b*_L1 may have areas that are smaller than those of the (1-2)-th and (2-2)-th level WL-driver regions 21*a*_L2 and 21*b*_L2. In the (1-1)-th and (2-1)-th level WL-driver regions 21*a*_L1 and 21*b*_L1 having such relatively small areas, selection transistors (e.g., of FIGS. 3 to 10C), which have the gate protruding portions GEP2 and GEP3 of relatively small gate widths or have the FinFET or MBCFET structures, may be disposed.

Figure 13B:
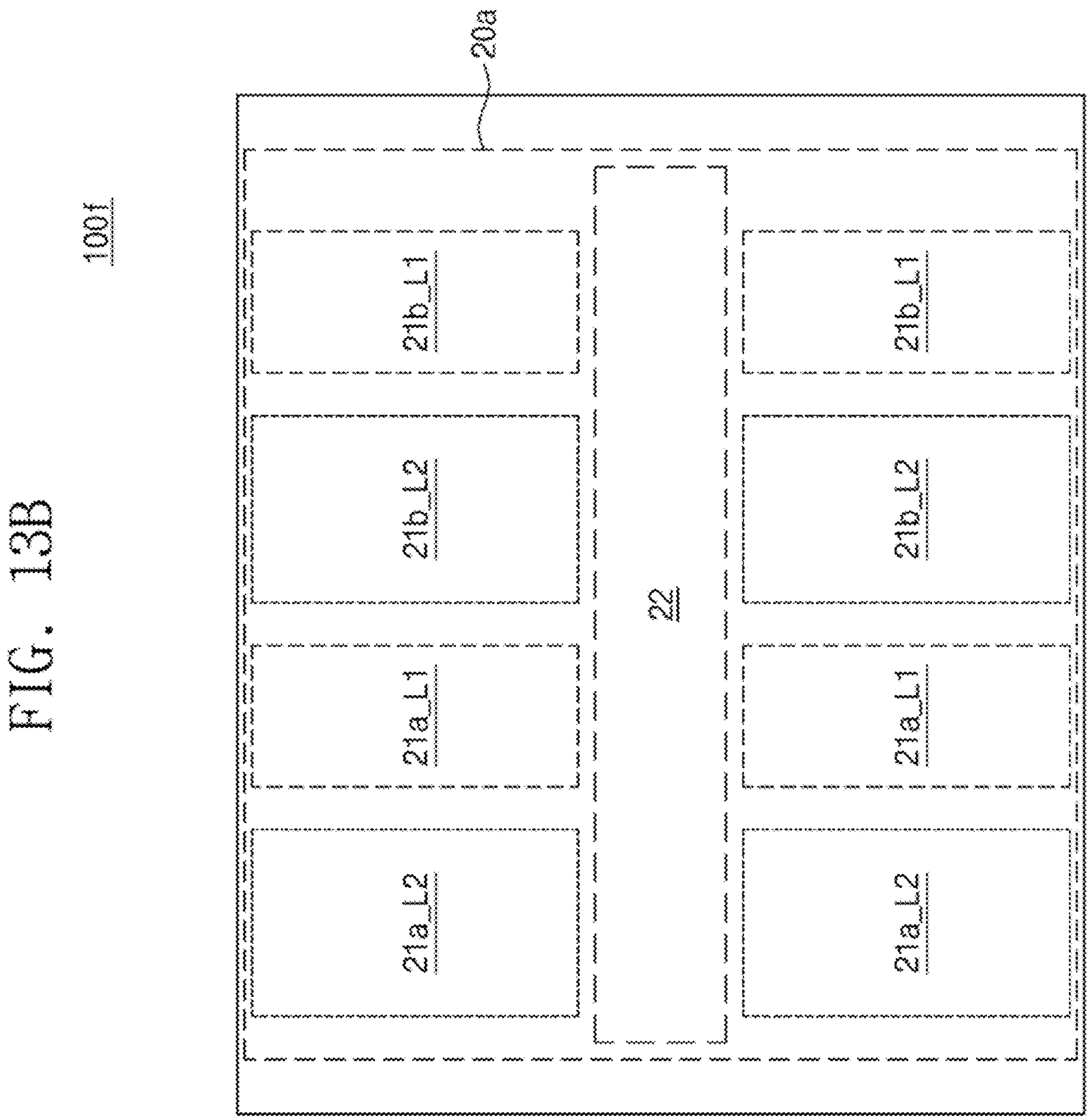
Figure 13C:
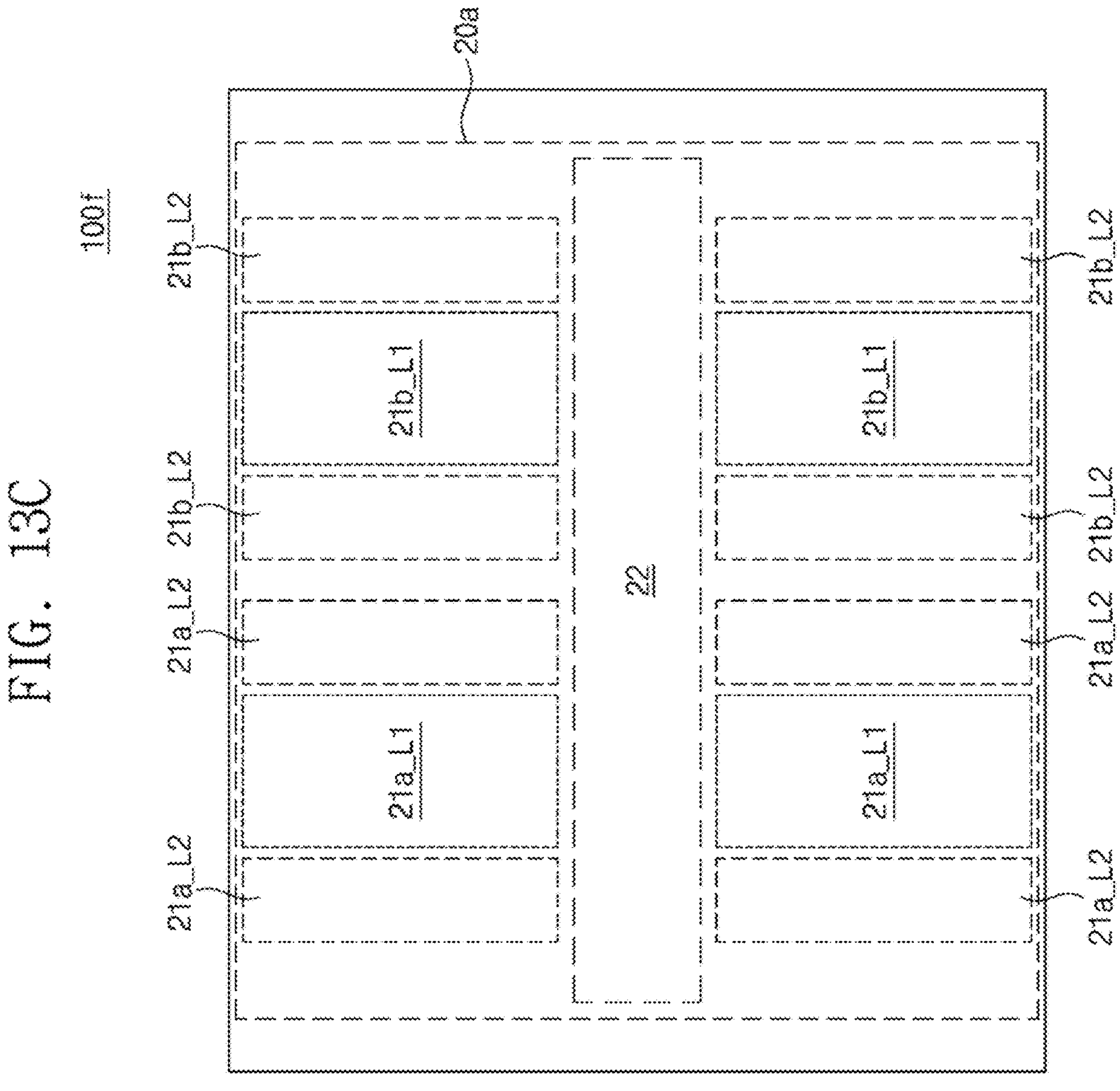
Figure 13D:
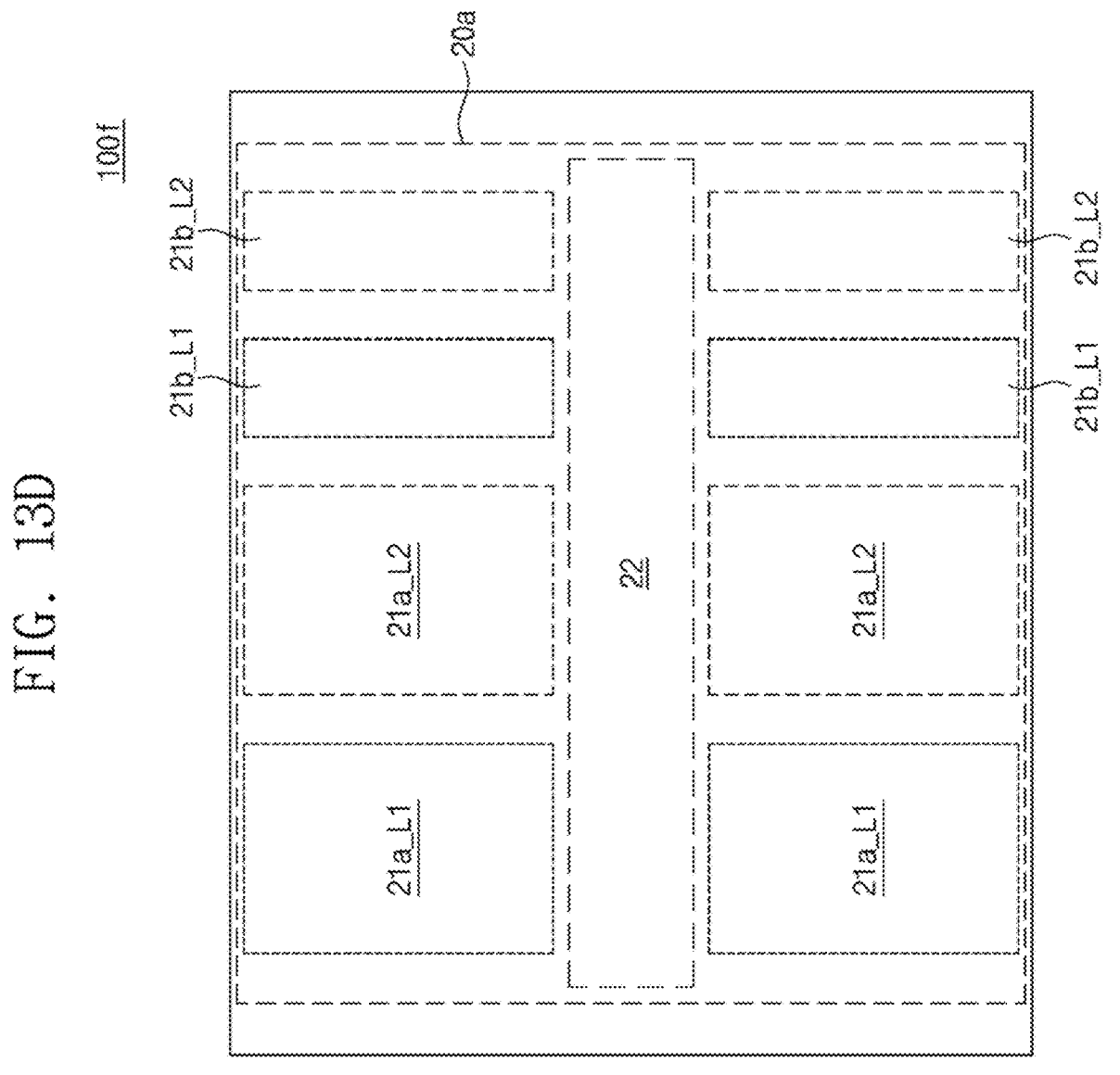

Alternatively, as shown in FIG. 13C, the (1-2)-th level WL-driver region 21*a*_L2 may be provided to have two sub-regions, which are separately disposed at both sides of the (1-1)-th level WL-driver region 21*a*_L1. Similarly, the (2-2)-th level WL-driver region 21*b*_L2 may be provided to have two sub-regions, which are separately disposed at both sides of the (2-1)-th level WL-driver region 21*b*_L1. Some of the second-level sub-word lines SWL_L2 may be connected to one of the (1-2)-th level WL-driver regions 21*a*_L2, and the remaining ones of the second-level sub-word lines SWL_L2 may be connected to the other of the (1-2)-th level WL-driver regions 21*a*_L2.

In the (1-2)-th and (2-2)-th level WL-driver regions 21*a*_L2 and 21*b*_L2, each of which is divided into the sub-regions of the relatively small area, the selection transistors (e.g., of FIGS. 3 to 10C), which have the gate protruding portions GEP2 and GEP3 of relatively small gate widths or have the FinFET or MBCFET structures, may be disposed.

Alternatively, as shown in FIG. 13D, the (2-1)-th and (2-2)-th level WL-driver regions 21*b*_L1 and 21*b*_L2 may be provided to have relatively small areas, and the selection transistors with the relatively small gate width may be disposed in the (2-1)-th and (2-2)-th level WL-driver regions 21*b*_L1 and 21*b*_L2. Except for these differences, other portions of the semiconductor device may be configured to have the same or similar features as the previous example embodiments.

Figure 14:
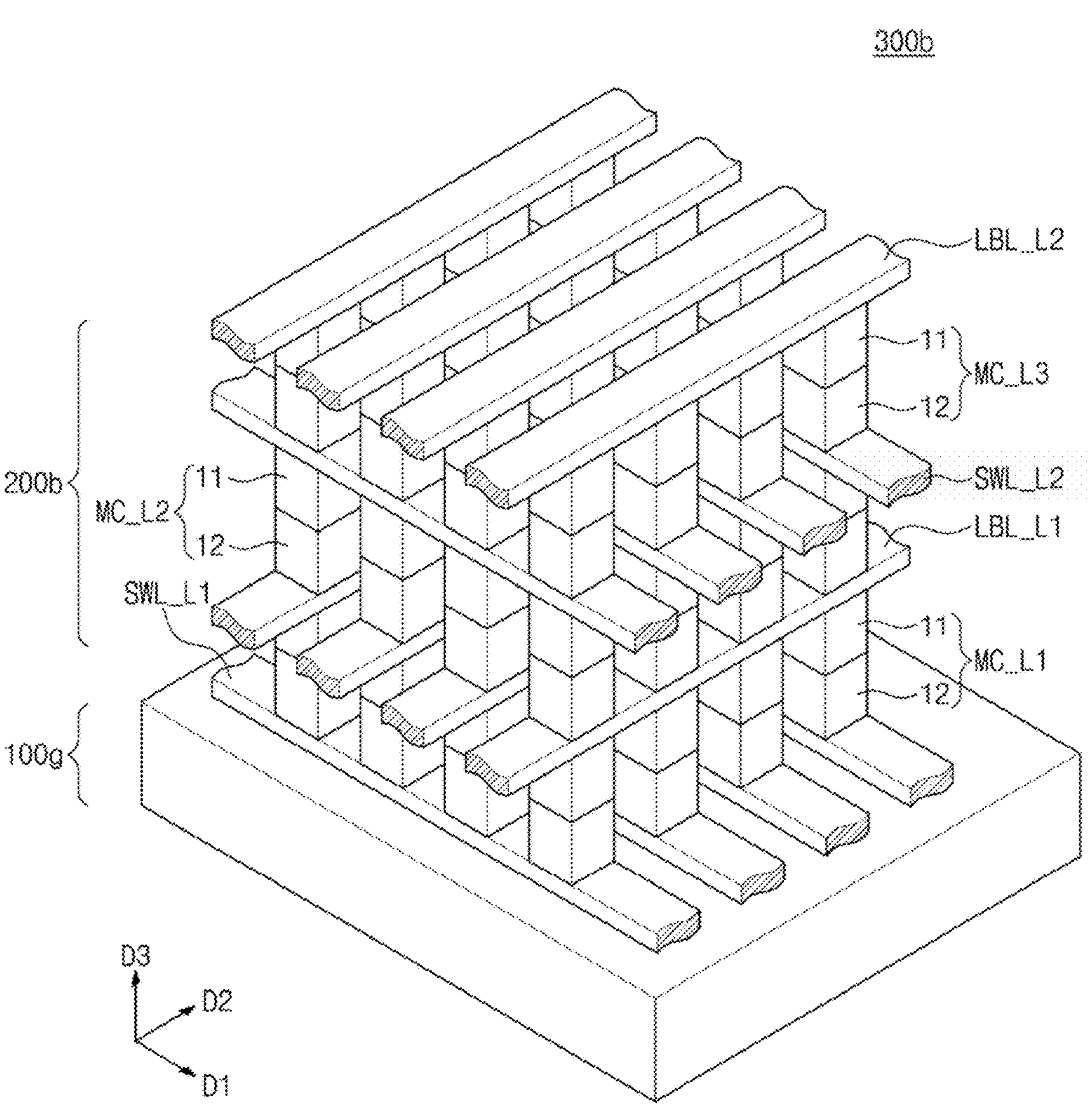
FIG. 14 is a perspective view illustrating a semiconductor memory device according to an example embodiment.
Figure 15:
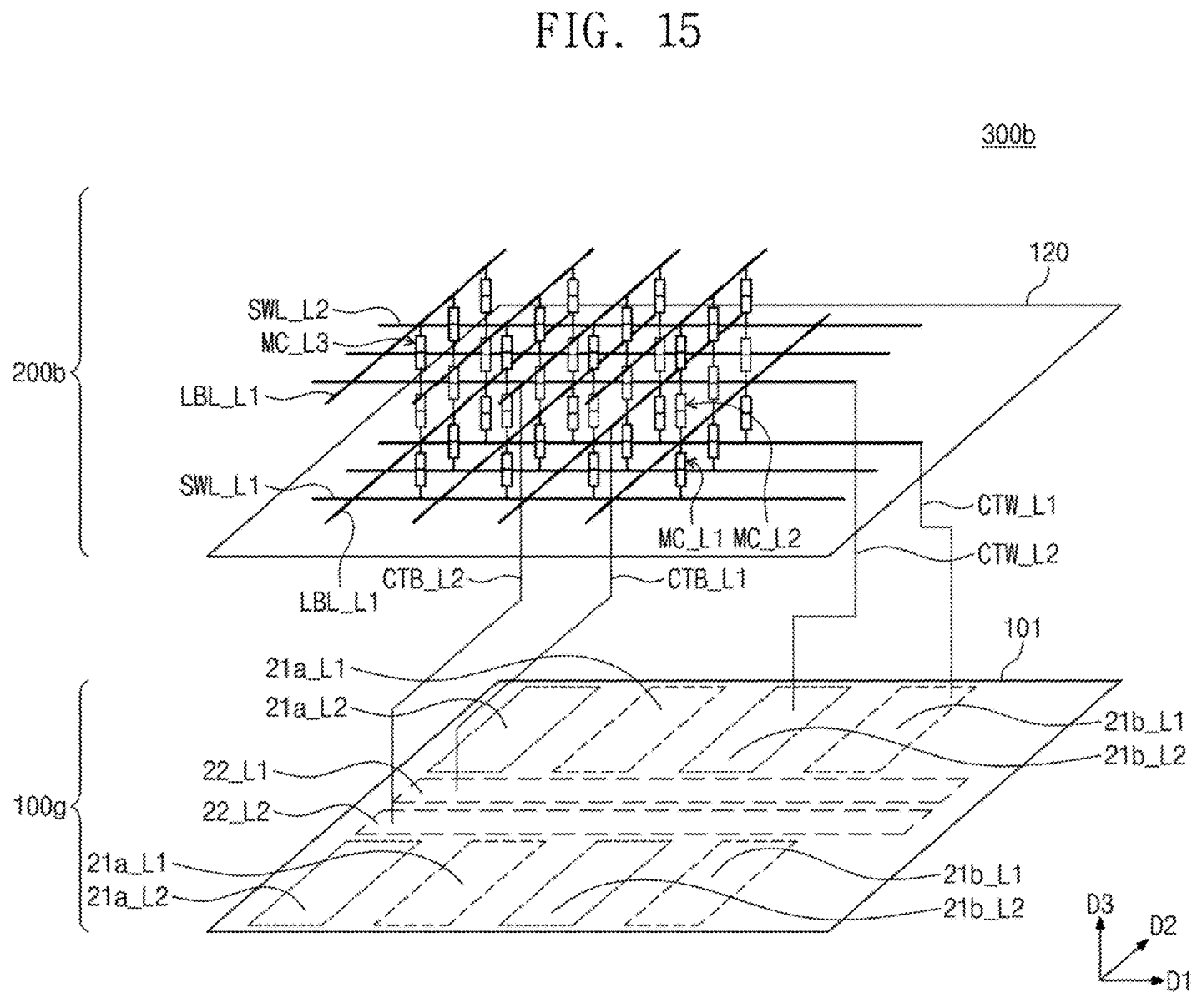
Figure 16A:
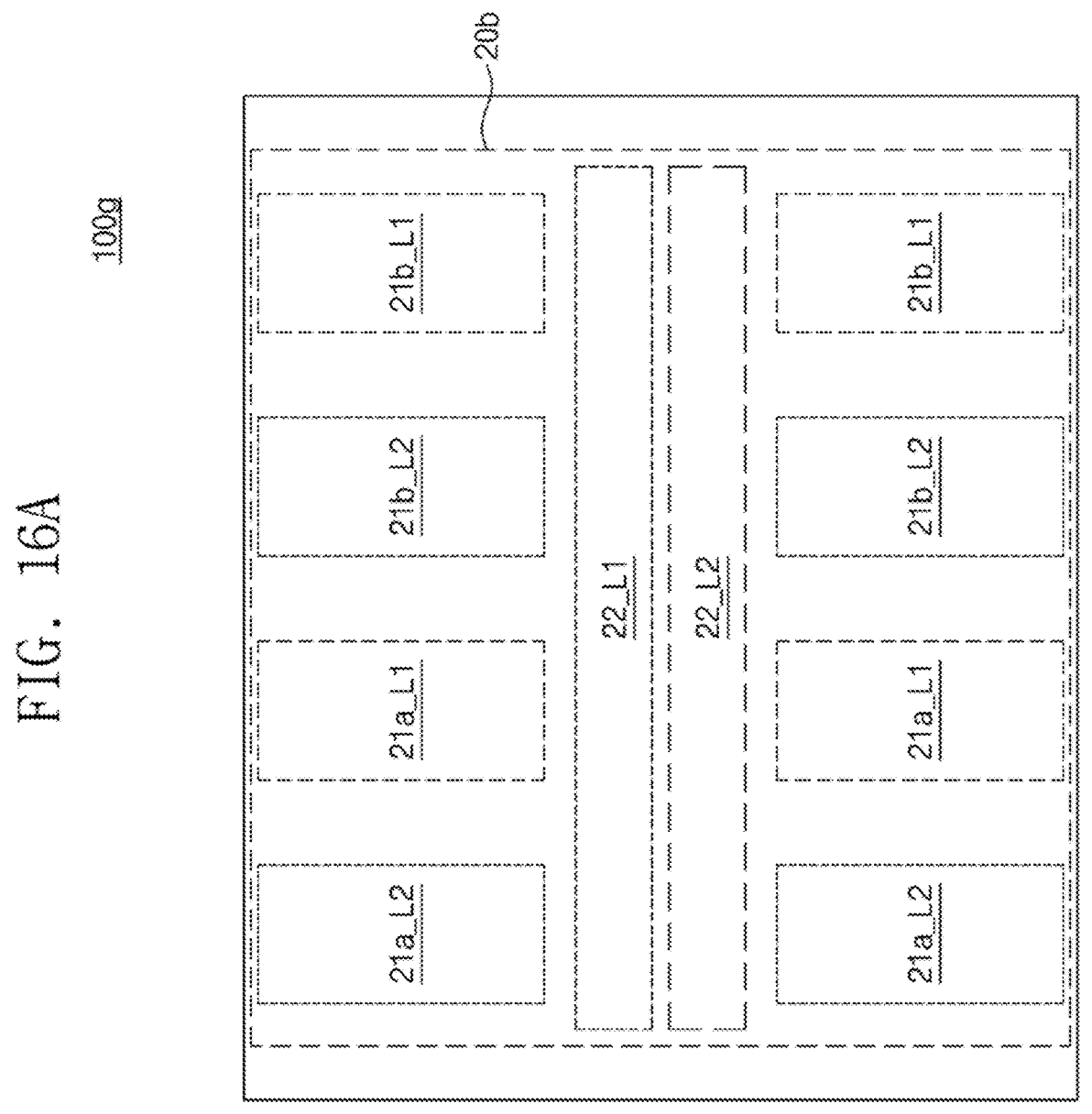
Figure 16B:
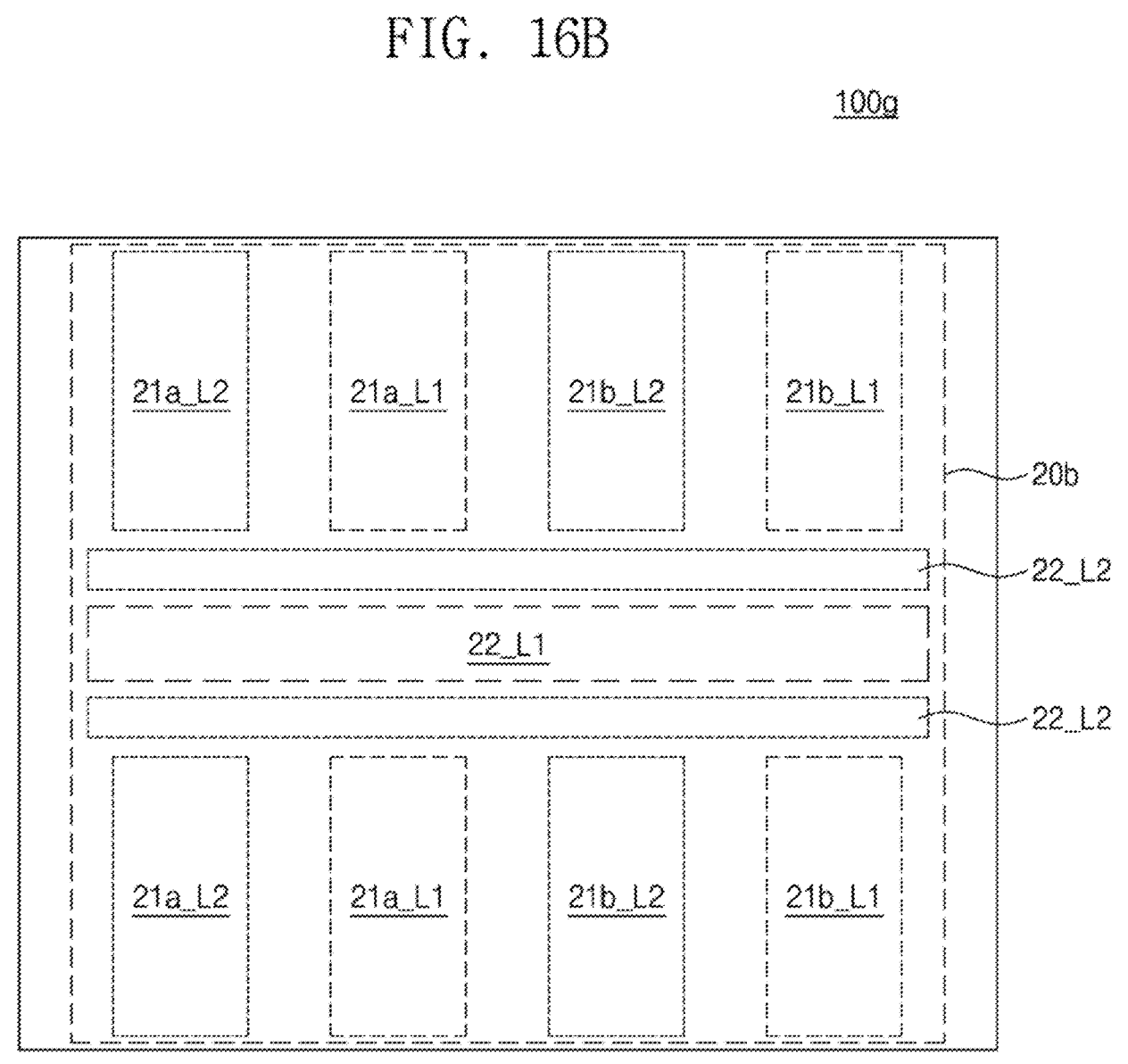

FIG. 14 is a perspective view illustrating a semiconductor memory device according to an example embodiment. FIG. 15 is a perspective view illustrating a connection structure between a cell array portion and a peripheral circuit portion of FIG. 14. FIGS. 16A and 16B are plan views, each of which illustrates a peripheral circuit portion according to an example embodiment.

Referring to FIGS. 14 to 16B, in a semiconductor memory device 300*b* according to the present example embodiment, a cell array portion 200*b* may be disposed on a peripheral circuit portion 100*g*.

The cell array portion 200*b* may include first-level sub-word lines SWL_L1, first-level memory cells MC_L1, first-level local bit lines LBL_L1, second-level memory cells MC_L2, second-level sub-word lines SWL_L2, third-level memory cells MC_L3, and second-level local bit lines LBL_L2, which are sequentially stacked.

A core region 20*b* may be disposed in the peripheral circuit portion 100*g*. The core region 20*b* may include a first-level BL-selection region 22_L1, a second-level BL-selection region 22_L2, the (1-2)-th level WL-driver region 21*a*_L2, the (1-1)-th level WL-driver region 21*a*_L1, the (2-2)-th level WL-driver region 21*b*_L2, and the (2-1)-th level WL-driver region 21*b*_L1. Each of the first- and second-level BL-selection regions 22_L1 and 22_L2 may have a long shape that is elongated in the first direction D1 and may cross the local bit lines LBL. The first- and second-level BL-selection regions 22_L1 and 22_L2 may be spaced apart from each other in the second direction D2.

Intermediate points of the first-level local bit lines LBL_L1 may be connected to the first-level BL-selection region 22_L1 (or the first-level BL-selection transistors therein) through first-level bit line connection contacts CTB_L1, respectively. Intermediate points of the second-level local bit lines LBL_L2 may be connected to the second-level BL-selection region 22_L2 (or the second-level BL-selection transistors therein) through second-level bit line connection contacts CTB_L2, respectively. The first- and second-level BL-selection regions 22_L1 and 22_L2 may have the same area and/or width or may have different areas and/or widths from each other. The BL-selection transistors BST of a relatively small gate width may be disposed in one of the first- and second-level BL-selection regions 22_L1 and 22_L2 having a smaller area.

Alternatively, as shown in FIG. 16B, the second-level BL-selection region 22_L2 may be provided to have two sub-regions, which are separately disposed in front of and behind the first-level BL-selection region 22_L1. Accordingly, the BL-selection transistors BST having a relatively small gate width may be disposed in the second-level BL-selection regions 22_L2 having a relatively small area. Except for these differences, other portions of the semiconductor device may be configured to have the same or similar features as the previous example embodiments.

Figure 17:
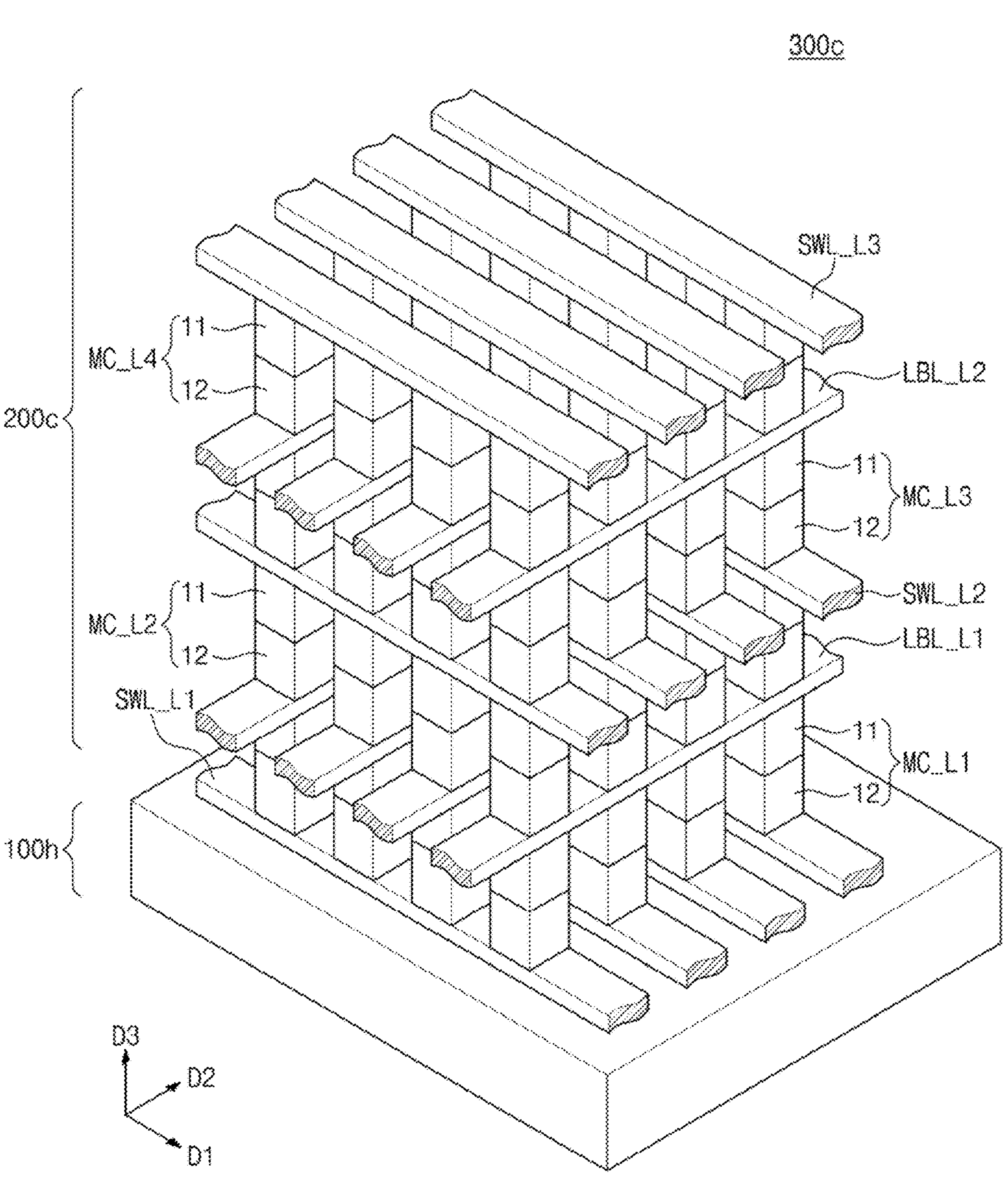
FIG. 17 is a perspective view illustrating a semiconductor memory device according to an example embodiment.
Figure 19A:
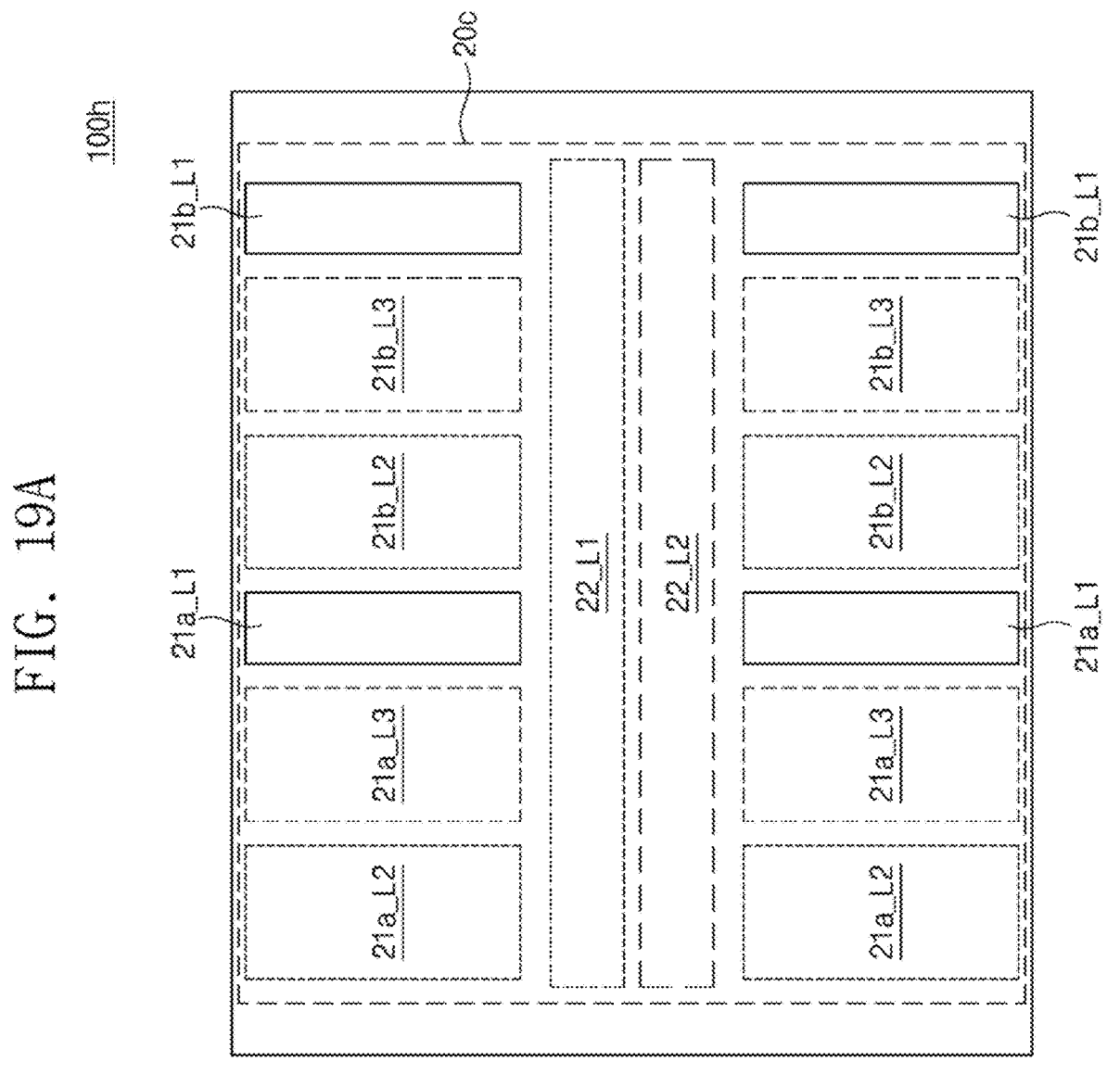
Figure 19B:
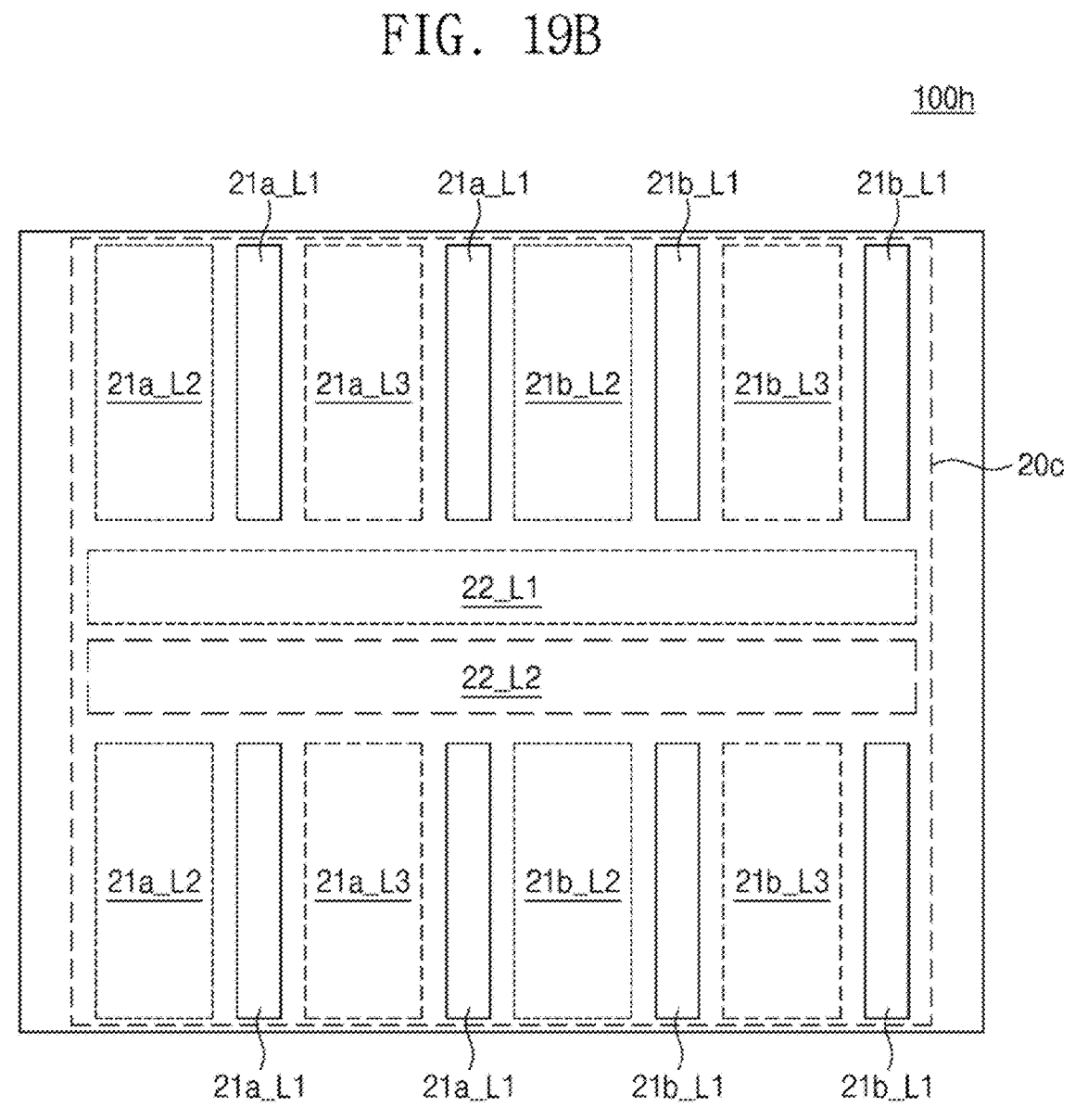

FIG. 17 is a perspective view illustrating a semiconductor memory device according to an example embodiment. FIG. 18 is a perspective view illustrating a connection structure between a cell array portion and a peripheral circuit portion of FIG. 17. FIGS. 19A and 19B are plan views, each of which illustrates a peripheral circuit portion according to an example embodiment.

Referring to FIGS. 17 to 19B, in a semiconductor memory device 300*c* according to the present example embodiment, a cell array portion 200*c* may be disposed on a peripheral circuit portion 100*h*.

The cell array portion 200*c* may include first-level sub-word lines SWL_L1, first-level memory cells MC_L1, first-level local bit lines LBL_L1, second-level memory cells MC_L2, second-level sub-word lines SWL_L2, third-level memory cells MC_L3, second-level local bit lines LBL_L2, forth-level memory cells MC_LA, and third-level sub-word lines SWL_L3, which are sequentially stacked.

Referring to FIG. 19A, a core region 20*c* may be disposed in the peripheral circuit portion 100*h*. The core region 20*c* may include the first- and second-level BL-selection regions 22_L1 and 22_L2, which are spaced apart from each other in the second direction D2 and have a long shape that is elongated in the first direction D1. The core region 20*c* may include a (1-2)-th level WL-driver region 21*a*_L2, a (1-3)-th level WL-driver region 21*a*_L3, a (1-1)-th level WL-driver region 21*a*_L1, a (2-2)-th level WL-driver region 21*b*_L2, a (2-3)-th level WL-driver region 21*b*_L3, and a (2-1)-th level WL-driver region 21*b*_L1, which are sequentially arranged in the first direction D1. The (1-1)-th and (2-1)-th level WL-driver regions 21*a*_L1 and 21*b*_L1 may have a relatively small area.

Alternatively, as shown in FIG. 19B, the (1-1)-th level WL-driver region 21*a*_L1 may be provided to have two sub-regions, which are separately disposed at both sides of the (1-3)-th level WL-driver region 21*a*_L3. The (2-1)-th level WL-driver region 21*b*_L1 may be provided to have two sub-regions, which are separately disposed at both sides of the (2-3)-th level WL-driver region 21*b*_L3. The second-level BL-selection region 22_L2 may be provided to have two sub-regions, which are separately disposed in front of or behind the first-level BL-selection region 22_L1. The selection transistors having a relatively small gate width may be disposed in the sub-regions having a relatively small area. Except for these differences, the semiconductor device according to the present example embodiment may be configured to have the same or similar features as the previous example embodiments.

Figure 20:
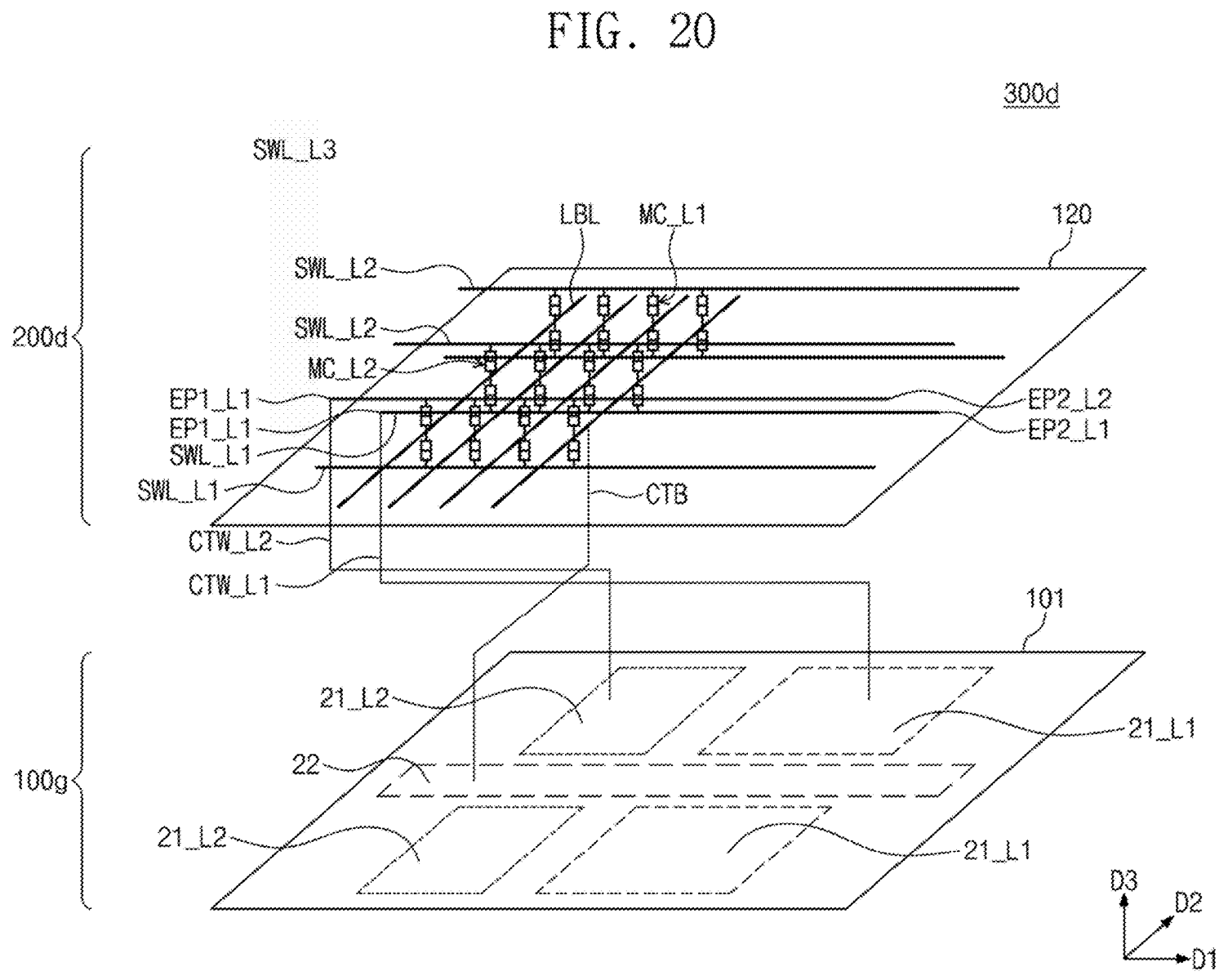
Figure 21:
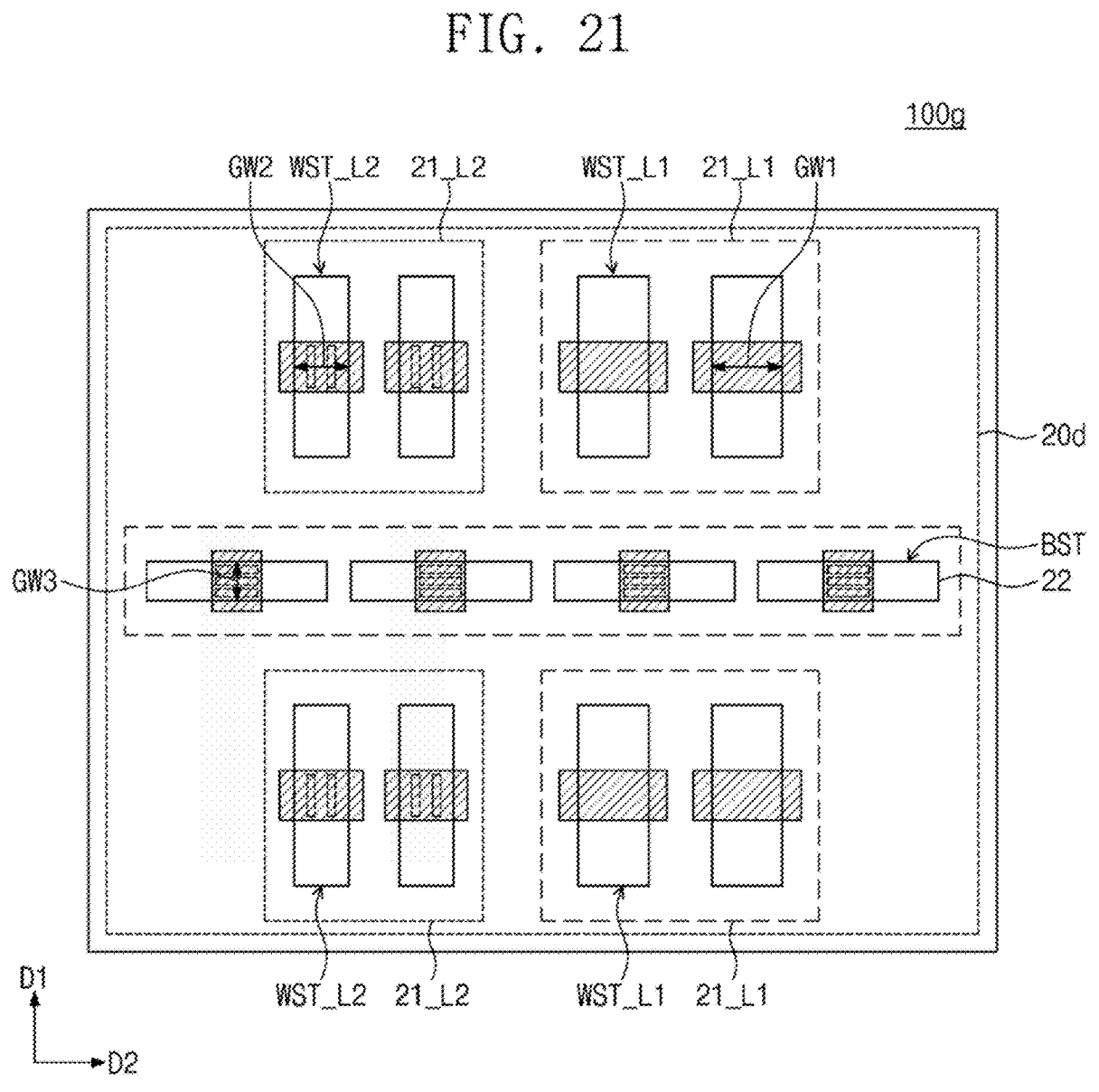

FIG. 20 is a diagram illustrating a modified example of the connection structure of FIG. 12. FIG. 21 is an enlarged plan view illustrating a peripheral circuit portion in FIG. 20.

Referring to FIGS. 20 and 21, in a semiconductor memory device 300*d* according to the present example embodiment, a cell array portion 200*d* may be disposed on the peripheral circuit portion 100*g*.

A core region 20*d* may be disposed in the peripheral circuit portion 100*g*. The core region 20*d* may include first-level WL-driver regions 21_L1, second-level WL-driver regions 21_L2, and a BL-selection region 22. Thus, the first-level WL-driver regions 21_L1, the second-level WL-driver regions 21_L2, and the BL-selection region 22 may be disposed in the peripheral circuit portion 100*g*. First-level WL-selection transistors WST_L1 may be disposed in the first-level WL-driver regions 21_L1. Second-level WL-selection transistors WST_L2 may be disposed in the second-level WL-driver regions 21_L2. The BL-selection transistors BST may be disposed in the BL-selection region 22. Each of the first-level WL-selection transistors WST_L1 may have the first gate width GW1. Each of the second-level WL-selection transistors WST_L2 may have the second gate width GW2. Each of the BL-selection transistors BST may have the third gate width GW3. At least one of the first, second, and third gate widths GW1, GW2, and GW3 may be different from the others. In an example embodiment, the first, second, and third gate widths GW1, GW2, and GW3 may be different from each other. The first-level WL-selection transistors WST_L1, the second-level WL-selection transistors WST_L2, and the BL-selection transistors BST may be different from each other in their size. The first-level WL-driver regions 21_L1, the second-level WL-driver regions 21_L2, and the BL-selection region 22 may be different from each other in their area.

For example, each of the first-level WL-selection transistors WST_L1 may have substantially the same structure as one of the first and second WL-selection transistors WST1 and WST2 described with reference to FIGS. 5A to 10D. Each of the second-level WL-selection transistors WST_L2 may have substantially the same structure as the other of the first and second WL-selection transistors WST1 and WST2 described with reference to FIGS. 5A to 10D.

The cell array portion 200*d* in the present example embodiment may be configured to have the same features as the cell array portion 200*d* of FIG. 12, but may differ from that of FIG. 12 in that only the first end portions EP1_L1 of the first-level sub-word lines SWL_L1 and the first end portions EP1_L2 of the second-level sub-word lines SWL_L2 are connected to the peripheral circuit portion 100*g*. The second end portions EP2_L1 of the first-level sub-word lines SWL_L1 and the second end portions EP2_L2 of the second-level sub-word lines SWL_L2 may not be connected to the peripheral circuit portion 100*g*. Thus, the first end portions EP1_L1 of the first-level sub-word lines SWL_L1 in the cell array portion 200*d* may be connected to the first-level WL-selection transistors WST_L1, which are provided in the first-level WL-driver regions 21_L1 of the peripheral circuit portion 100*g*, through the first-level WL-connection contacts CTW_L1. The first end portions EP1_L2 of the second-level sub-word lines SWL_L2 in the cell array portion 200*d* may be connected to the second-level WL-selection transistors WST_L2, which are provided in the second-level WL-driver regions 21_L2 of the peripheral circuit portion 100*g*, through the second-level WL-connection contacts CTW_L2. Except for these differences, the semiconductor device according to the present example embodiment may be configured to have the same or similar features as the previous example embodiments.

The example embodiments described with reference to FIGS. 1 to 21 may be combined to realize various example embodiments. In the present specification, each of the (sub/main) word line and the (local/global) bit line may be referred to as a 'conductive line'. The WL-driver region and the BL-selection region may be referred to as a 'conductive line selection region' or 'selection region'. Although, in the above structure, each region is illustrated to have two sub-regions, example embodiments are not limited thereto and the number of the sub-regions of each region may be three or more. Furthermore, the memory cells may be provided to form five or more layers, and in this case, additional conductive lines connected thereto may be further disposed. The selection regions connected to the conductive lines may be disposed in a manner of combining, using or modifying those illustrated in the plan views of FIGS. 13A to 13D, 16A, 16B, 19A, and 19B.

According to an example embodiment, a peripheral circuit portion may be disposed below a cell array portion, and this may make it possible to realize a highly-integrated semiconductor memory device. In addition, by using three-dimensional transistors (e.g., transistors with gate protruding portions, FinFETs, or MBCFETs), it may be possible to reduce an area of a region in which selection transistors are disposed, without deterioration in performance of the semiconductor memory device, and thereby effectively increase an integration density of the semiconductor memory device.

As described above, embodiments relate to a semiconductor memory device with an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:

first conductive lines provided on a substrate and extending in a first direction in parallel, the first direction being parallel to a top surface of the substrate; and first selection transistors and second selection transistors respectively connected to the first conductive lines, wherein:

each of the first selection transistors has a first gate width, and each of the second selection transistors has a second gate width that is different from the first gate width, wherein the first selection transistors and the second selection transistors are located below the first conductive lines.

2. The device as claimed in claim 1, wherein:

the substrate includes a first selection region, in which the first selection transistors are disposed, and a second selection region, in which the second selection transistors are disposed, and an area of the first selection region is larger than an area of the second selection region.

3. The device as claimed in claim 1, wherein the first gate width corresponds to a width in a second direction of a first active region underlying a corresponding first gate, and the second gate width corresponds to a width in the second direction of a second active region underlying a corresponding second gate.

4. The device as claimed in claim 1, wherein:

each of the first selection transistors includes a first gate electrode, each of the second selection transistors includes a second gate electrode, the first gate electrode includes at least one first gate protruding portion that protrudes into the substrate, the second gate electrode includes at least two second gate protruding portions that protrude into the substrate, and a total number of protruding portions of the at least one first gate protruding portion is smaller than a total number of protruding portions of the at least two second gate protruding portions.

5. The device as claimed in claim 1, wherein:

each of the first selection transistors includes a first gate electrode, each of the second selection transistors includes a second gate electrode, the first gate electrode includes at least one first gate protruding portion that protrudes into the substrate, the second gate electrode includes at least one second gate protruding portion that protrudes into the substrate, and a distance from a surface of the substrate to a bottom end of the first gate protruding portion is shorter than a distance from the surface of the substrate to a bottom end of the at least one second gate protruding portion.

6. The device as claimed in claim 1, further comprising a device isolation layer, which is provided in the substrate and defines at least one first active fin and at least one second active fin protruding from the top surface of the substrate, wherein:

the at least one first active fin and the at least one second active fin protrude above a top surface of the device isolation layer, each of the first selection transistors includes a first gate electrode crossing over the at least one first active fin, each of the second selection transistors includes a second gate electrode crossing over the at least one second active fin, and a height of a top end of the at least one first active fin from the top surface of the device isolation layer is lower than a height of a top end of the at least one second active fin from the top surface of the device isolation layer.

7. The device as claimed in claim 1, further comprising a device isolation layer, which is provided in the substrate and defines at least one first active fin and at least two second active fins protruding from the top surface of the substrate, wherein:

the at least one first active fin and the at least two second active fins protrude above a top surface of the device isolation layer, each of the first selection transistors includes a first gate electrode crossing over the at least one first active fin, each of the second selection transistors includes a second gate electrode crossing over the at least two second active fins, and a total number of the at least two second active fins is greater than a total number of the at least one first active fin.

8. The device as claimed in claim 1, further comprising a device isolation layer, which is provided in the substrate and defines a plurality of first active fins and a plurality of second active fins protruding from the top surface of the substrate, wherein:

the plurality of first active fins and the plurality of second active fins protrude above a top surface of the device isolation layer, each of the first selection transistors includes a first gate electrode crossing over the plurality of first active fins, each of the second selection transistors includes a second gate electrode crossing over the plurality of second active fins, and a distance between the plurality of second active fins is smaller than a distance between the plurality of first active fins.

9. The device as claimed in claim 1, further comprising:

a device isolation layer, which is provided in the substrate to define at least one first active fin and at least one second active fin, the at least one first active fin and the at least one second active fin protruding above a top surface of the device isolation layer; and at least one second channel pattern stacked on the at least one second active fin, wherein:

each of the first selection transistors includes a first gate electrode covering side and top surfaces of the at least one first active fin, and each of the second selection transistors includes a second gate electrode, which is interposed between the at least one second active fin and the at least one second channel pattern and covers side and top surfaces of the at least one second active fin.

10. The device as claimed in claim 9, further comprising at least one first channel pattern stacked on the at least one first active fin, wherein:

the first gate electrode is interposed between the at least one first channel pattern and the at least one first active fin, the at least one second channel pattern includes at least two second channel patterns, and a total number of channel patterns of the at least one first channel pattern is smaller than a total number of channel patterns of the at least two second channel patterns.

11. The device as claimed in claim 1, further comprising:

a plurality of second conductive lines, which are provided on the first conductive lines and extend in a second direction in parallel, the second direction being parallel to the top surface of the substrate and crossing the first direction; and third selection transistors connected to the second conductive lines, respectively, wherein:

each of the third selection transistors has a third gate width, and the third gate width is different from at least one of the first and second gate widths.

12. The device as claimed in claim 11, further comprising:

a plurality of third conductive lines, which are provided on the second conductive lines and extend in the first direction in parallel; and fourth selection transistors connected to the third conductive lines, respectively, wherein:

each of the fourth selection transistors has a fourth gate width, and the fourth gate width is different from at least one of the first to third gate widths.

13. The device as claimed in claim 12, wherein:
the substrate includes:
a first selection region, in which the first selection transistors are disposed;
a second selection region, in which the second selection transistors are disposed;
a third selection region, in which the third selection transistors are disposed; and
a fourth selection region, in which the fourth selection transistors are disposed,
the first selection region, the second selection region, and the fourth selection region are spaced apart from each other in the first direction,
the third selection region is spaced apart from the first selection region, the second selection region, and the fourth selection region in the second direction, and
the third selection region has a shape that is elongated in the first direction.

14. The device as claimed in claim 13, wherein:
the fourth selection region includes a first sub-selection region, in which some of the fourth selection transistors are disposed, and a second sub-selection region, in which others of the fourth selection transistors are disposed,
the first sub-selection region is disposed between the first selection region and the second selection region, and
the second sub-selection region is spaced apart from the first sub-selection region by the first selection region.

15. A semiconductor memory device, comprising:
a cell array portion disposed on a peripheral circuit portion, wherein:
the cell array portion includes:
first conductive lines, which extend in a first direction and are spaced apart from each other in a second direction crossing the first direction;
second conductive lines, which are provided on the first conductive lines and extend in the second direction and are spaced apart from each other in the first direction; and
memory cells respectively disposed between the first conductive lines and the second conductive lines,
the peripheral circuit portion includes:
first selection transistors, which are disposed on a first selection region on a substrate and are connected to the first conductive lines; and
second selection transistors, which are disposed on a second selection region on the substrate and are connected to the second conductive lines,
an area of the first selection region is different from an area of the second selection region.

16. The device as claimed in claim 15, wherein:
each of the first selection transistors has a first gate width in the second direction, and
each of the second selection transistors has a second gate width in the second direction that is different from the first gate width.

17. The device as claimed in claim 15, wherein:
each of the first selection transistors includes a first gate electrode,
each of the second selection transistors includes a second gate electrode,
the first gate electrode includes at least one first gate protruding portion that protrudes into the substrate,
the second gate electrode includes at least one second gate protruding portion that protrudes into the substrate, and
a total number of protruding portions of the at least one first gate protruding portion is different from a total number of protruding portions of the at least one second gate protruding portion.

18. A semiconductor memory device, comprising:
first conductive lines provided on a substrate and extending in a first direction;
second conductive lines provided on the first conductive lines and extending in a second direction crossing the first direction;
third conductive lines provided on the second conductive lines and extending in the first direction;
fourth conductive lines provided on the third conductive lines and extending in the second direction;
first selection transistors, which are respectively connected to the first conductive lines and have a first gate width;
second selection transistors, which are respectively connected to the second conductive lines and have a second gate width; and
third selection transistors, which are respectively connected to the third conductive lines and have a third gate width,
wherein the first gate width is different from the second and third gate widths.

19. The device as claimed in claim 18, further comprising:
first, second, third, and fourth selection regions, which are provided on the substrate and are connected to the first to fourth conductive lines, respectively, wherein:
the first selection region and the third selection region are spaced apart from each other in the first direction,
the second selection region and the fourth selection region are spaced apart from each other in the second direction and have a shape elongated in the first direction, and
an area of the first selection region is different from an area of the third selection region, or an area of the second selection region is different from an area of the fourth selection region.

20. The device as claimed in claim 19, wherein:
the third selection region includes a first sub-selection region, which is connected to some of the third conductive lines, and a second sub-selection region, which is connected to others of the third conductive lines,
the first sub-selection region is disposed between the first selection region and the third selection region, and
the second sub-selection region is spaced apart from the first sub-selection region by the third selection region.

* * * * *